US012783751B2

(12) United States Patent
Zhao et al.

(10) Patent No.: US 12,783,751 B2
(45) Date of Patent: Nov. 3, 2026

(54) TECHNIQUES FOR DESIGN SPACE EXPLORATION IN A MULTI-USER COLLABORATION SYSTEM

(71) Applicant: AUTODESK, INC., San Francisco, CA (US)

(72) Inventors: Dale Zhao, New York City, NY (US); David Benjamin, Brooklyn, NY (US); Rui Wang, New York City, NY (US)

(73) Assignee: AUTODESK, INC., San Francisco, CA (US)

( * ) Notice: Subject to any disclaimer, the term of this patent is extended or adjusted under 35 U.S.C. 154(b) by 1115 days.

(21) Appl. No.: 17/889,287

(22) Filed: Aug. 16, 2022

(65) Prior Publication Data

US 2024/0028787 A1 Jan. 25, 2024

Related U.S. Application Data

(60) Provisional application No. 63/391,244, filed on Jul. 21, 2022.

(51) Int. Cl.
*G06F 30/20* (2020.01)
*G06T 15/00* (2011.01)

(52) U.S. Cl.
CPC ............ *G06F 30/20* (2020.01); *G06T 15/005* (2013.01)

(58) Field of Classification Search
CPC .............................. G06F 30/20; G06T 15/005
USPC .............................................................. 703/6
See application file for complete search history.

(56) References Cited

U.S. PATENT DOCUMENTS 11,429,758 B1 * 8/2022 Schaffer .................. B61L 27/53
2021/0383261 A1 * 12/2021 Hanna ...................... G06N 5/04
2023/0185997 A1 * 6/2023 Hakimi ................ G06Q 10/101
706/16

* cited by examiner

*Primary Examiner* — Andre Pierre Louis
(74) *Attorney, Agent, or Firm* — Artegis Law Group, LLP

(57) ABSTRACT

One embodiment of a computer-implemented method for generating design solutions to one or more design problems comprises receiving a first design model that is associated with a first design problem; generating a first multi-dimensional data point based on the first design model; mapping the first design model to a first node of a trained self-organizing map based on the first multi-dimensional data point, wherein the first node corresponds to a first location within a design space; and displaying a visual representation of the first design model residing at the first location within the design space based on the first node.

20 Claims, 10 Drawing Sheets

TECHNIQUES FOR DESIGN SPACE EXPLORATION IN A MULTI-USER COLLABORATION SYSTEM

CROSS-REFERENCE TO RELATED APPLICATIONS

This application claims the priority benefit of United States provisional patent application titled, "TECHNIQUES FOR DESIGN SPACE EXPLORATION IN A MULTI-USER COLLABORATION SYSTEM," filed on Jul. 21, 2022 and having Ser. No. 63/391,244. The subject matter of this related application is hereby incorporated herein by reference.

BACKGROUND

Field of the Various Embodiments

Embodiments of the present disclosure relate generally to computer science and computer-aided design software and, more specifically, to techniques for design space exploration in a multi-user collaboration system.

Description of the Related Art

Urban planning involves a large group of stakeholders that have differing goals for a given project. For example, civic leaders, developers, environmentalists, potential tenants, and other stakeholders can be involved in designing and creating an urban project, such as a city center or a large residential complex. Each stakeholder has different goals and different metrics for measuring those goals. For example, a civil servant may focus on how well a project provides access to various services, while an environmentalist may focus on the carbon footprint imposed by the project. Although the goals of different stakeholders may not be in direct conflict, the differing goals usually require a given design for a given project to balance a large number of competing objectives under different constraints.

One approach for preparing urban designs is to use a collaborative design application that allows multiple users, such as different stakeholders, to work on a given urban design simultaneously. Among other things, conventional collaborative design applications typically allow different users to view a shared design and modify various aspects of the shared design or various elements included in the shared design. For example, different instances of the collaborative design application that are executing on different user workstations could be modifying the same shared design. When a given user makes a modification to the shared design, the other instances of the collaborative design application are synchronized such that the modifications to the shared design are reflected at the other user workstations. The other users are able to view the modifications to the shared design and make further changes to the modified design. Accordingly, using the collaborative design application, multiple users can arrive at a final design that reflects contributions made by different users.

One drawback of using collaborative design applications is that the software is not configured to enable users to compare different design options or different versions of a shared design. In this regard, to enable multiple users to collectively view and edit a shared design, the collaborative design application is typically configured to display a single version of design at any given time. Because of this limitation, users cannot easily view different versions of the shared design to determine which designs have already been considered and how the shared design has changed over time. For example, to view a previous version of a shared design, users typically have to open a file containing the previous version or undo changes made to the current design to revert to the previous version. Not only are these approaches tedious and subject to error, these approaches do not allow users to compare the previous version of the shared design with the current version of the shared design. As a result, when using a collaborative design application, users often do not properly explore the overall design space and consider designs that are more optimal (e.g., better matches the project specifications, meets more stakeholder goals, obtains better performance metrics, has a lower cost, etc.) than the designs already created by the users.

As the foregoing illustrates, what is needed in the art are more effective ways to generate and evaluate collaborative designs.

SUMMARY

One embodiment of the present disclosure sets forth a computer-implemented method for generating design solutions to one or more design problems. The method includes receiving a first design model that is associated with a first design problem. The method further includes generating a first multi-dimensional data point based on the first design model. In addition, the method includes mapping the first design model to a first node of a trained self-organizing map based on the first multi-dimensional data point, where the first node corresponds to a first location within a design space, and displaying a visual representation of the first design model residing at the first location within the design space based on the first node.

At least one technical advantage of the disclosed techniques relative to the prior art is that, with the disclosed techniques, a collaborative design application can track and visualize changes to a design when multiple stakeholders are simultaneously modifying the design. More particularly, the disclosed techniques enable stakeholders to visualize where each previously-considered design falls within a design space and identify design features within the design space that have not been fully considered during the design modification process. As a result, the collaborative design application can guide the stakeholders to generate designs in areas of the design space that have not yet been fully explored. Among other things, the disclosed techniques enable stakeholders to more effectively navigate tradeoffs between stakeholder goals under different design constraints and arrive at more optimal design solutions compared to what can be achieved using prior art techniques. These technical advantages provide one or more technological improvements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

In the following description, numerous specific details are set forth to provide a more thorough understanding of the various embodiments. However, it will be apparent to one skilled in the art that the inventive concepts may be practiced without one or more of these specific details.

System Overview

Figure 1:
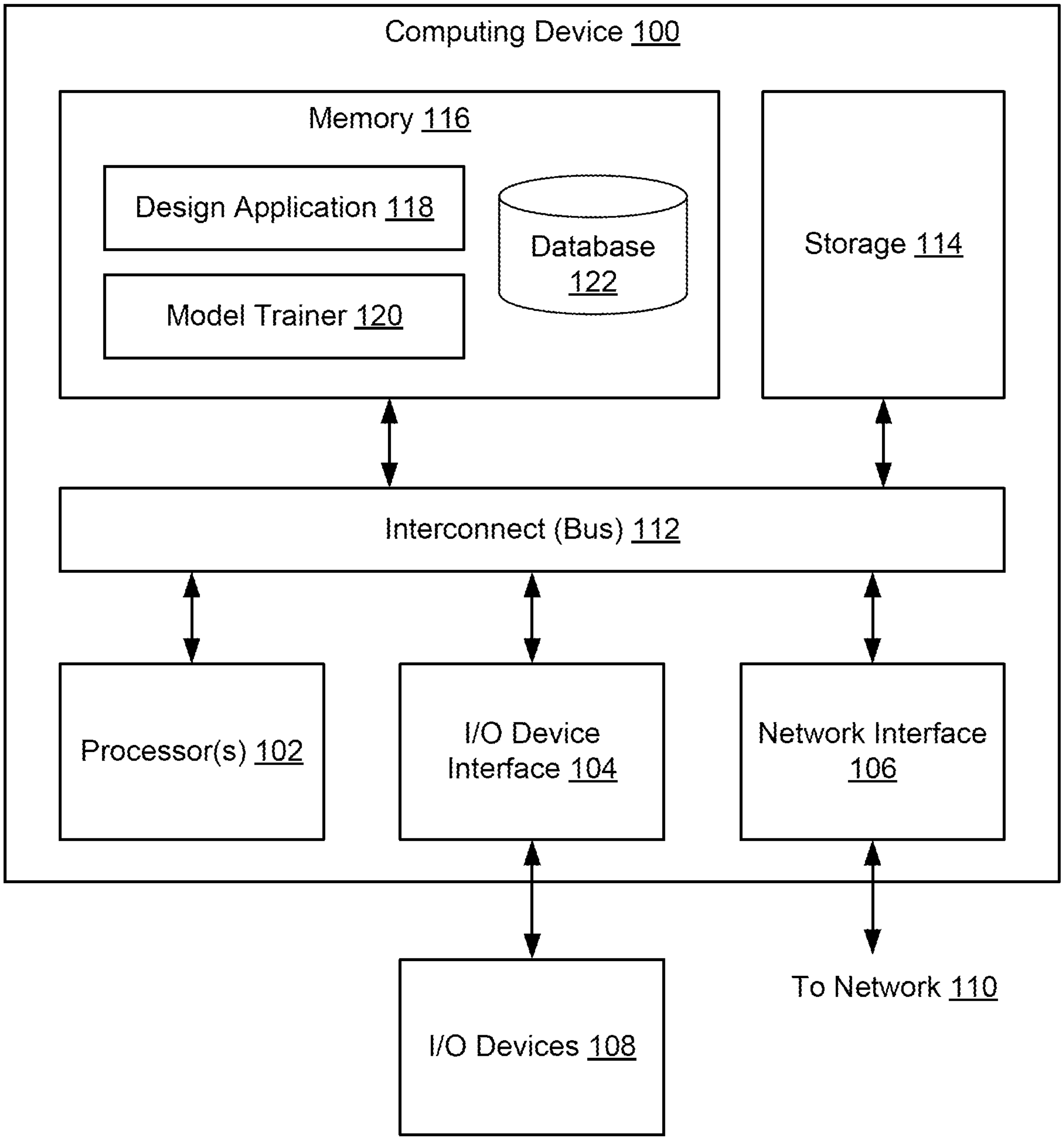
FIG. 1 is a block diagram of a computing system configured to implement one or more aspects of the various embodiments.

FIG. 1 illustrates a computing device 100 configured to implement one or more aspects of the various embodiments. As shown, computing device 100 includes an interconnect (bus) 112 that connects one or more processing units 102, an input/output (I/O) device interface 104 coupled to one or more input/output (I/O) devices 108, memory 116, a storage 114, and a network interface 106 connected to a network 110.

Computing device 100 includes a server computer, a desktop computer, a laptop computer, a smart phone, a personal digital assistant (PDA), tablet computer, or any other type of computing device configured to receive input, process data, and optionally display images, and is suitable for practicing one or more embodiments. Computing device 100 described herein is illustrative and that any other technically feasible configurations fall within the scope of the present disclosure.

Processing unit(s) 102 includes any suitable processor implemented as a central processing unit (CPU), a graphics processing unit (GPU), an application-specific integrated circuit (ASIC), a field programmable gate array (FPGA), an artificial intelligence (AI) accelerator such as a tensor processing unit (TPU), any other type of processing unit, or a combination of different processing units, such as a CPU configured to operate in conjunction with a GPU. In general, processing unit(s) 102 may be any technically feasible hardware unit capable of processing data and/or executing software applications. Further, in the context of this disclosure, the computing elements shown in computing device 100 may correspond to a physical computing system (e.g., a system in a data center) or may be a virtual computing embodiment executing within a computing cloud.

In one embodiment, I/O devices 108 include devices capable of providing input, such as a keyboard, a mouse, a touch-sensitive screen, and so forth, as well as devices capable of providing output, such as a display device. Additionally, I/O devices 108 may include devices capable of both receiving input and providing output, such as a touchscreen, a universal serial bus (USB) port, and so forth. I/O devices 108 may be configured to receive various types of input from an end-user (e.g., a designer) of computing device 100, and to also provide various types of output to the end-user of computing device 100, such as displayed digital images or digital videos or text. In some embodiments, one or more of I/O devices 108 are configured to couple computing device 100 to a network 110.

Network 110 includes any technically feasible type of communications network that allows data to be exchanged between computing device 100 and external entities or devices, such as a web server or another networked computing device. For example, network 110 may include a wide area network (WAN), a local area network (LAN), a wireless (WiFi) network, and/or the Internet, among others.

Storage 114 includes non-volatile storage for applications and data, and may include fixed or removable disk drives, flash memory devices, and CD-ROM, DVD-ROM, Blu-Ray, HD-DVD, or other magnetic, optical, or solid-state storage devices. Design application 118 and model trainer 120 can be stored in storage 114 and loaded into memory 116 when executed. In addition, database 122 can be stored in storage 114 and the data stored in database 122 loaded into memory 116 during execution of design application 118 and/or model trainer 120.

Memory 116 includes a random-access memory (RAM) module, a flash memory unit, or any other type of memory unit or combination thereof. Processing unit(s) 102, I/O device interface 104, and network interface 106 are configured to read data from and write data to memory 116. Memory 116 includes various software programs that can be executed by processing unit(s) 102 and application data associated with said software programs.

As shown in FIG. 1, memory 116 includes design application 118, model trainer 120, and database 122. As discussed in further detail below, model trainer 120 trains one or more self-organizing maps for use by design application 118. A self-organizing map is a type of neural network that receives a high dimensionality data set and generates a lower dimensionality (e.g., two-dimensional) representation of the data set. In some embodiments, model trainer 120 receives a data set associated with a plurality of design solutions for a given design problem. Model trainer 120 trains a self-organizing map based on the data set. The trained self-organizing map corresponds to a two-dimensional representation of possible design solutions for the given design problem and includes a plurality of map nodes. Each map node corresponds to a cluster of design solutions that share similar features (e.g., performance metrics, model geometry, cost, design goals met by the design solutions, and/or the like). Design application 118 receives a design model and determines a map node of a trained self-organizing map that corresponds to the design model. The map node indicates the location of the design model within the design space represented by the self-organizing map. Design application 118 generates a visualization of the design model within the design space. In some embodiments, the visualization includes a 2D grid, where each cell of the 2D grid corresponds to a different map node of the self-organizing map. The design model is displayed in a cell of the 2D grid that corresponds to the map node corresponding to the design model. Design application 118 causes the visualization to be displayed to a user, e.g., via a display device included in I/O devices 108. Database 122 stores data used by design application 118 and/or model trainer 120, such as past designs, design data associated with a current design and/or with past designs, design rules and goals, evaluation criteria, and/or the like.

In some embodiments, a user can use design application 118 to generate and/or modify a design model. The design application 118 receives input from a user (e.g., via I/O devices 108) and performs one or more modifications to a design model to generate an updated design model. Design application 118 displays a visualization of the updated design model within the design space. In other embodiments, design application 118 receives one or more design models from a separate application that is used to generate and/or modify design models and displays a visualization of the one or more design models within a design space.

Although FIG. 1 illustrates design application 118 and model trainer 120 executing on a single computing device 100, in other embodiments, functionality of the design application 118 and/or model trainer 120 can be distributed across any number of pieces of software that execute in any technically feasible manner and on any number of computing devices. For example, in some embodiments, multiple instances of design application 118 can be deployed on a number of computing devices. One instance of design application 118 could load a design model or receive a design model (e.g., from another instance of design application 118) and determine a location of the design model within a design space. The instance of design application 118 generates and displays a visualization of the design model within the design space. Additionally, the instance of design application 118 can transmit information to the other instances of design application 118 to cause the other instances of design application 118 to display the visualization at the respective computing device.

Additionally, in some embodiments, multiple users can modify a shared design model using different instances of design application 118 executing on different computing devices. In such embodiments, design application 118 is configured to receive input from a user, perform one or more modifications to the shared design model to generate an updated design model, and cause the shared design model at the other instances of design application 118 to be updated to reflect the modifications made by the user.

Although FIG. 1 illustrates a model trainer 120 that is separate from design application 118, in some embodiments, model trainer 120 could be included in design application 118 and/or design application 118 could include functionality for training machine learning models, such as self-organizing maps.

Design Space Exploration Using Self-Organizing Maps

Figure 2:
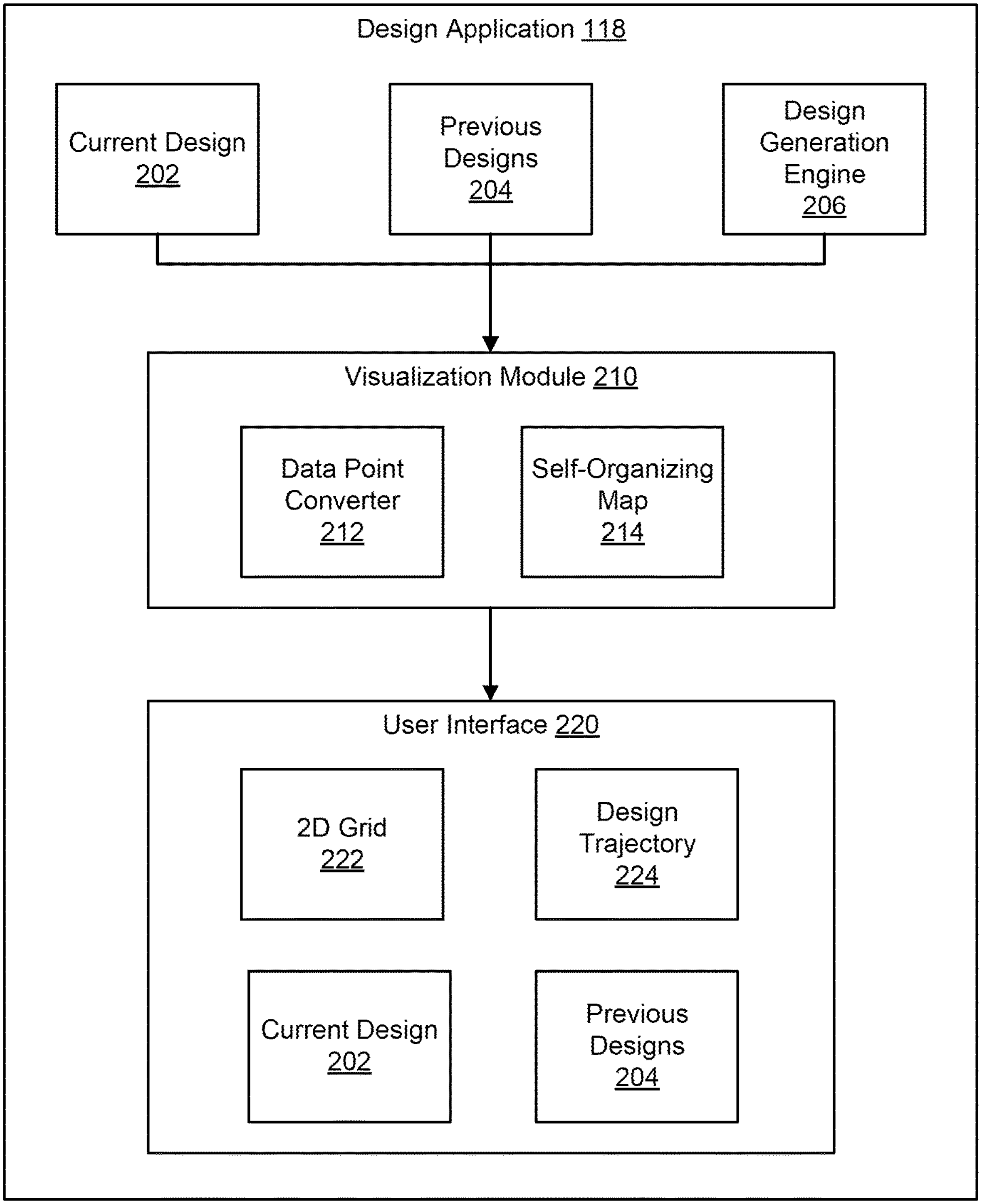
FIG. 2 is a more detailed illustration of the design application of FIG. 1, according to various embodiments.

FIG. 2 is a more detailed illustration of the design application 118 of FIG. 1, according to various embodiments. As shown, design application 118 includes a current design 202, one or more previous designs 204, design generation engine 206, visualization module 210, and user interface 220.

In some embodiments, current design 202 is a current version of a design model generated using design application 118. For example, design application 118 could include a model editor (not shown) that receives inputs from a user and modifies the design model by adding, modifying, and/or removing portions of the design model based on the user input. As another example, a user could specify one or more design parameters and design application 118 could generate a design model based on the one or more design parameters (e.g., using design generation engine 206). In some embodiments, current design 202 is a design model that was received by design application 118. For example, design application 118 could receive a design model from another instance of design application 118 or other application that generated the design model.

Each previous design 204 corresponds to a previous version of the current design 202. For example, each time the design model is modified and the current design becomes a previous design 204, and the modified design becomes the new current design 202. In some embodiments, each edit to a design model creates a new version of the design model.

In some embodiments, design application 118 stores data associated with the one or more previous designs 204. The data can be any suitable data from which a previous design 204 can be derived. For example, design application 118 could store one or more design models, where each design model corresponds to a different previous design 204. As another example, design application 118 could store edit history for a design model, where the edit history tracks the changes made to the design model over time (e.g., additions, modifications, and/or deletions to portions of the design model).

As shown in FIG. 2, design application 118 includes a design generation engine 206. In some embodiments, design generation engine 206 receives a design problem and generates a plurality of candidate design solutions based on the design problem. A design problem specifies one or more parameters that each candidate design solution has to meet, such as different design goals, design constraints, design characteristics, metrics that the design should meet, and/or the like. Design generation engine 206 can generate the plurality of candidate design solutions using any technically feasible approach. In some embodiments, design generation engine 206 receives a design model, such as current design 202 or a previous design 204, and generates a plurality of candidate design solutions based on the design model. For example, design generation engine 206 could process the design model and determine a design problem associated with the design model.

Visualization module 210 displays a visualization of a design model, such as the current design 202, one or more previous designs 204, and/or one or more designs generated by design generation engine 206 via user interface 220. The visualization indicates a location of the design model within a design space for a design problem associated with the design model. As shown in FIG. 2, visualization module 210 includes a data point converter 212 and one or more self-organizing maps 214.

Data point converter 212 receives the design model and generates a multi-dimensional data point based on the design model. In some embodiments, the data point is a vector that includes a plurality of data values. The data values can be of any suitable data type, such as real or numeric data type. In some embodiments, each data value is a numeric data type or a data type that can be converted into a numeric data type.

Each data value corresponds to a different feature associated with the design model. A feature associated with a design model could be, for example and without limitation, a geometric feature of the design model, a metric associated with the design model, whether the design model satisfies a given design rule, whether the design model includes a given design feature or characteristic, and/or the like. A geometric feature could be, for example, a length of the design model, a width of the design model, a height of the design model, a volume of the design model, a surface area of the design model, a circumference of the design model, a number of different portions or parts included in the design model, a number of curves included in the design model, a number of lines included in the design model, a number of angles included in the design model, and/or the like. The specific features used to generate the multi-dimensional data point can vary based on the design model and the design problem associated with the design model. In various embodiments, any suitable feature with a numeric value or whose value can be converted into or represented as a numeric value can be used in generating the multi-dimensional data point.

In some embodiments, the set of features used by data point converter 212 to generate the multi-dimensional data point from a design model is specified by a user, e.g., via user interface 122. For example, a user could specify which geometric features, metrics, design rules, design constraints, and/or the like should be included in the multi-dimensional data point. In some embodiments, design application 118 determines, based on the design problem and/or the design model, a plurality of features associated with the design model that can be used by data point converter 212 to generate multi-dimensional data points. Design application 118 displays the plurality of features and the user can specify one or more features included in the plurality of features that should be included when generating multi-dimensional data points.

In some embodiments, data point converter 212 determines the set of features to use when generating the multi-dimensional data point based on the design model. For example, data point converter 212 could analyze the design model to identify one or more geometric features that are applicable to the design model. Data point converter 212 determines data values corresponding to each of the identified geometric features and includes the data values in the multi-dimensional data point. As another example, data point converter 212 could analyze the design model to determine a design problem associated with the design model. Data point converter 212 determines one or more features associated with the design problem, such as design parameters, rules, and/or metrics. Data point converter 212 determines data values corresponding to each feature associated with the design problem and includes the data value in the multi-dimensional data point.

In various embodiments, data point converter 212 generates multi-dimensional data points for design models associated with the same design problem using the same set of features. For example, data point converter 212 uses the same set of features when generating a multi-dimensional data point based on current design 202 and when generating a multi-dimensional data point based on a previous design 204.

Visualization module 210 maps the design model to a map node included in self-organizing map 214 based on the multi-dimensional data point. Self-organizing map 214 corresponds to a two-dimensional representation of possible design solutions for a design problem associated with the design model. Each map node included in the self-organizing map 214 corresponds to a cluster of design solutions that share similar features (e.g., performance metrics, model geometry, cost, design goals met by the design solutions, and/or the like). The design model is mapped to a map node that is associated with features that are most similar to the features of the design model. In some embodiments, a self-organizing map 214 is configured to receive a multi-dimensional data point as input and output data indicating the map node that most closely matches the multi-dimensional data point. In some embodiments, the output data includes data specifying a grid cell of a two-dimensional grid, such as 2D grid 222. In some embodiments, visualization module 210 determines, based on the output data, the grid cell of 2D grid 222 that corresponds to a map node indicated by the output data.

Visualization module 210 displays, via user interface 220, the design model within the corresponding grid cell of 2D grid 222. As shown in FIG. 2, user interface 220 includes a 2D grid 222, a design trajectory 224, the current design 202, and the one or more previous designs 204.

2D grid 222 is a grid that visually represents the self-organizing map 214. Each grid cell of 2D grid 222 corresponds to a different map node of the self-organizing map 214. As a result, 2D grid 222 is a visual representation of the design space for the design problem associated with the self-organizing map 214 and the design model (e.g., current design 202 and/or previous designs 204). Each cell of 2D grid 222 represents design solutions within the design space that share similar features. Similar to the nodes of the self-organizing map 214, grid cells that are nearby in 2D grid 222 have features that are more similar to each other, while grid cells that are further apart have features that are more different from one another. Accordingly, the location within 2D grid 222 at which a design is displayed indicates the location of the design within a design space. A given design has features that are more similar to features of designs that are located close to the given design on 2D grid 222 compared to features of designs that are located further away from the given design on 2D grid 222.

In some embodiments, visualization module 210 receives current design 202 and generates a multi-dimensional data point corresponding to current design 202. Visualization module 210 determines, based on self-organizing map 214, the grid cell of 2D grid 222 that is associated with the current design 202. Visualization module 210 displays, via user interface 220, the current design 202 at the location of the associated grid cell within 2D grid 222.

In some embodiments, visualization module 210 receives one or more previous designs 204 and generates, for each previous design 204, a multi-dimensional data point corresponding to the previous design 204. Visualization module 210 determines, based on self-organizing map 214, a grid cell of 2D grid 222 that is associated with each of the one or more previous designs 204. Visualization module 210 displays, via user interface 220, each previous design 204 at the location of the associated grid cell within 2D grid 222.

In some embodiments, visualization module 210 determines an order associated with the one or more previous designs 204. Visualization module 210 displays, via user interface 220, a design trajectory 224 associated with the one or more previous designs 204 based on the order associated with the one or more previous designs. The design trajectory 224 visually represents the order in which the one or more previous designs 204 were generated. For example, in some embodiments, the design trajectory 224 includes a line that connects each of the previous designs 204. Additionally, in some embodiments, the design trajectory 224 includes one or more labels (e.g., numbers) indicating the order in which the one or more previous designs 204 were generated.

In some embodiments, a user can zoom in on a design displayed in 2D grid 222 to view the design in more detail and/or interact with the design to modify the design. Additionally, in some embodiments, when a user zooms in on a given design, one or more additional designs are displayed in conjunction with the given design. The one or more additional designs are designs that are associated with the same grid cell in which the given design is located. Each of the one or more additional designs have features that are similar to the given design, but one or more portions or aspects of each additional design differs from the given design. For example, an additional design could include one or more additional elements that are not included in the given design, could not include one or more elements that are included in the given design, the measurements of an element included in the additional design could differ from the measurements of a corresponding element in the given design, and/or the like. A user can reference the one or more additional designs when determining what modifications to make to the given design.

In some embodiments, the one or more additional designs include designs that were used to train the self-organizing map 214 and were mapped to the map node corresponding to the zoomed in grid cell. In some embodiments, design application 118 provides the given design to design generation engine 206, and design generation engine 206 generates one or more designs based on the given design.

Although embodiments are described herein with respect to a two-dimensional self-organizing map 214 and a two-dimensional grid 222, in various embodiments, the self-organizing map 214 and corresponding visualization in user interface 220 could have a different dimensionality (e.g., one or three dimensions).

In some embodiments, design application 118 is a collaborative design application. Multiple users each use a different instance of design application 118 that is executing on a different computing device to view and/or modify a shared design model. When a user modifies a shared design model using a first instance of the design application 118, the modifications to the shared design model are propagated to the other instances of the design application 118. As an example, each other instance of design application 118 could receive data indicating the modifications to the shared design model and perform the modifications on a local version of the shared design model. As another example, each other instance of design application 118 could receive an updated version of the shared design model and replace the local version of the shared design model with the updated version. Accordingly, each instance of design application 118 displays a most recent version of the shared design model, and users can view and/or perform further modifications on the most recent version of the shared design model.

In some embodiments, when an instance of design application 118 generates or receives an updated version of the shared design model, the instance of design application 118 updates the user interface 220 to display a visual representation of the updated version of the shared design model within 2D grid 222.

In some embodiments, when an instance of design application 118 receives data indicating the modifications to the shared design model and/or an updated shared design model, the instance of design application 118 also receives data indicating a location within 2D grid 222 for displaying a visual representation of the updated shared design model. When a user modifies a shared design model using a first instance of the design application 118, the first instance of the design application 118 determines a location of the modified design within a design space and causes data indicating the location of the modified design within the design space (e.g., data indicating a node of a self-organizing map 214 and/or a grid cell of 2D grid 222) to be transmitted to the other instances of the design application 118.

Because each instance of design application 118 displays a visual representation of a location of the current design model within the design space while multiple users are simultaneously modifying the design, the multiple users can visualize and track how and/or whether changes to a design affect the location of the design within the design space. Additionally, by displaying a visual representation of one or more previous design models in conjunction with the current design model, the users can visualize where each previous design falls within the design space and where each previous design is located within the design space relative to the other designs. As a result, design application 118 can guide users towards generating designs in areas of the design space that have not been fully explored (e.g., areas of the design space where few or no designs are located).

In some embodiments, model trainer 120 trains the self-organizing map 214 used by design application 118 to determine a location of a design model within a design space. Model trainer 120 trains the self-organizing map 214 based on a given design problem. Design application 118 uses the trained self-organizing map 214 to determine the location of design models associated with the given design problem within a design space for the given design problem.

In some embodiments, design application 118 generates a set of training data and provides the training data to model trainer 120. The model trainer 120 trains a self-organizing map 214 based on the received training data and provides the trained self-organizing map 214 to design application 118. In some embodiments, a separate application could generate the set of training data and provide the training data to model trainer 120. In some embodiments, design application 118 includes functionality for training the self-organizing map 214. In such embodiments, design application 118 generates the set of training data and trains a self-organizing map 214 based on the set of training data.

Figure 3:
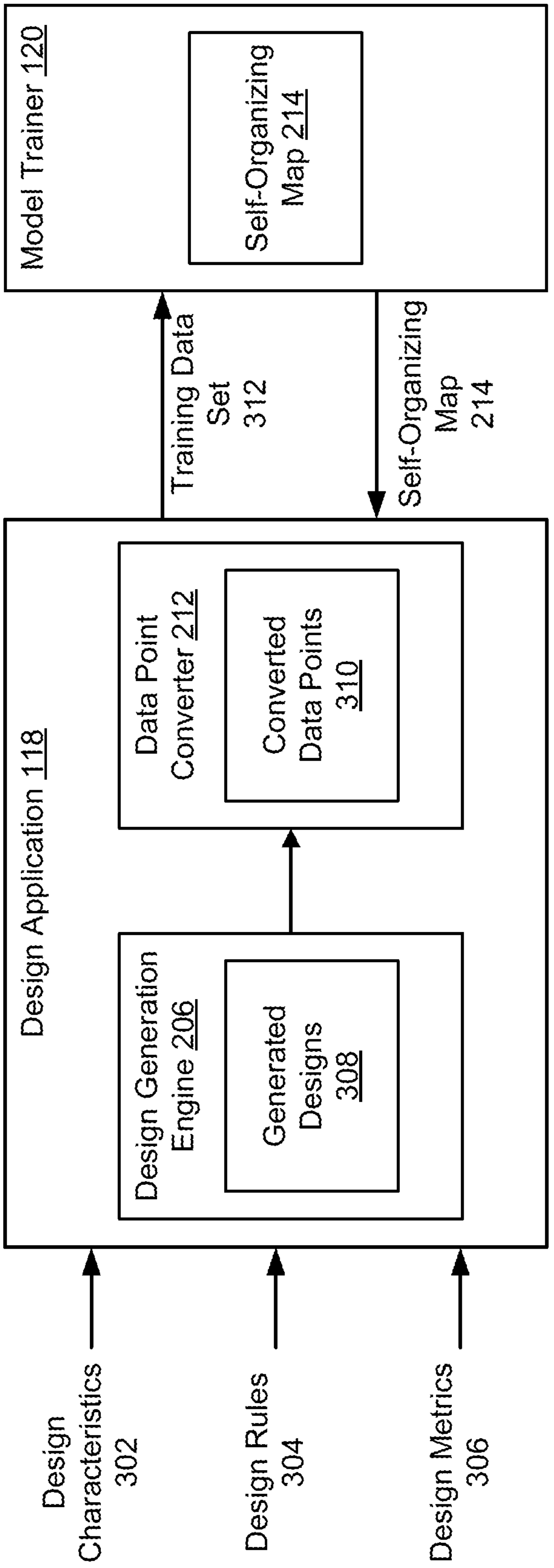
FIG. 3 illustrates an approach for training a self-organizing map, according to various embodiments.

FIG. 3 illustrates an approach for training a self-organizing map 214, according to various embodiments. As shown in FIG. 3, design application 118 receives a set of design characteristics 302, a set of design rules 304, and a set of design metrics 306. In some embodiments, the set of design characteristics 302, the set of design rules 304, and the set of design metrics 306 are associated with a given design problem. The set of design characteristics 302 specify one or more characteristics of design solutions for the given design problem. The set of design rules 304 specify one or more rules that should be used when generating design solutions for the given design problem. The set of design metrics 306 specify one or more metrics used to evaluate design solutions that are generated for the given design problem.

A design characteristic 302 can be any characteristic or feature associated with a design, such as a geometric characteristic of the design model, a visual characteristic, a characteristic or feature associated with an object included in the design, a characteristic or feature associated with an object that is associated with the design or other objects included in the design, a characteristic or feature associated with the type of design, and/or the like. As an example, if a design problem is associated with a building design, the characteristics or features associated with a building include building shape, building dimensions, number of different portions or elements of the building, building color, the texture or materials of the building exterior, the texture or materials of different building elements, number of different building features (e.g., number of doors, windows, floors), target capacity, expected use, building type (e.g., residential, commercial, office, warehouse), and/or the like.

A design rule 304 can be any rule or criteria that specifies a limitation associated with a design and/or a filter on generated designs. For example, a rule or criteria could specify that designs for the given design problem must have a specified characteristic or feature, specify that designs must not include a specified characteristic or feature, specify required value(s) for a particular characteristic or feature, specify maximum and/or minimum values for a particular characteristic or features, specify that designs should meet a given metric 306, specify minimum and/or maximum values for a particular metric 306, specify required value(s) for a particular metric, and/or the like. The limitations that can be specified by a design rule 304 can vary based on the design problem and the type of design. In addition, the type of limitation specified by a design rule 304 can vary based on the aspect of the design that is being limited by the design rule. For example, a design rule 304 associated with a numeric attribute could specify a single value, a range of values, a set of values, a minimum value, and/or a maximum value for the numeric attribute. A design rule 304 associated with a non-numeric attribute (e.g., text or Boolean) could specify a specific value or a specific set of values for the attribute.

Design metrics 306 can be any suitable metric that is used to evaluate a design. The design metric 306 can be a metric that is derived or calculated directly from the design, such as from one or more design characteristics 302, or could be a metric that is derived or calculated based on analyzing the design (e.g., using one or more simulation or analytical tools).

Although FIG. 3 illustrates design application 118 receiving a set of design characteristics 302, a set of design rules 304, and a set of design metrics 306, in some embodiments design application 118 does not receive one or more of design characteristics 302, design rules 304, or design metrics 306. For example, in some embodiments, design application 118 receives a set of design characteristics 302 and does not receive a set of design rules 304 or a set of design metrics 306. As another example, in some embodiments, design application 118 receives a set of design rules 304 and does not receive a set of design characteristics 302 or a set of design metrics 306.

Design generation engine 206 generates a plurality of designs 308 based on one or more of the design characteristics 302, design rules 304, and the design metrics 306. Each design included in the plurality of designs 308 differs in at least one aspect from each other design included in the plurality of designs 308. In some embodiments, each design 308 generated by design generation engine 206 has the one or more design characteristics 302. In some embodiments, each design 308 generated by design generation engine 206 meets each design rule 304 included in the one or more design rules 304. Design generation engine 206 can generate a design 308 using any suitable design generation approach or technique. For example, in some embodiments, design generation engine 206 generates the plurality of designs 308 using procedural content generation techniques.

In some embodiments, design application 118 receives one or more designs instead of receiving a set of design characteristics 302, set of design rules 304, and/or set of design metrics 306. Design application 118 processes the one or more designs to determine a design problem associated with the one or more designs. For example, design application 118 could analyze the one or more designs and generate a set of design characteristics 302, a set of design rules 304, and/or a set of design metrics 306. Design generation engine 206 generates the plurality of designs 308 based on the determined design problem.

In some embodiments, design application 118 receives one or more designs in addition to receiving a set of design characteristics 302, set of design rules 304, and/or set of design metrics 306. Design generation engine 206 uses the one or more designs as initial designs when generating the plurality of designs 308 based on the set of design characteristics 302, set of design rules 304, and/or set of design metrics 306. For example, design generation engine 206 could perform one or more operations based on each received design to produce a series of generative designs from each received design.

Data point converter 212 receives the set of generated designs 308 and generates, for each design 308, a converted data point 310 corresponding to the design 308. Each converted data point 310 is a multi-dimensional data point (e.g., vector data point) that represents various features of the design. A feature could be, for example, a design characteristic 302, a design rule 304, a design metric 306, a feature that is derived from a design characteristic 302, a design rule 304, or a design metric 306, and/or the like. For example, a first feature represented by a converted data point 310 could be the value for a given design characteristic 302. As another example, a second feature represented by a converted data point 310 could be whether the generated design 308 satisfies a given design rule 304. As a third example, a third feature represented by a converted data point 310 could be the value for a given design metric 306.

In some embodiments, data point converter 212 analyzes each generated design 308 to determine the feature value for each feature represented by the multi-dimensional data point. In some embodiments, each converted data point 310 is a real vector (i.e., the data values contained in the converted data point 310 are real numbers). In such embodiments, if the feature value for a given feature is not a real number, data point converter 212 converts the feature value to a numeric value. Data point converter 212 can use any suitable technique or approach for converting data values into real numbers. As an example, if the feature value for a given feature is a Boolean value, data point converter 212 could represent the feature value as the number 1 for a true value and a number 0 for a false value. As another example, if the feature value for a given feature is one value from a set of possible feature values, data point converter 212 could assign a different numeric value to each possible feature value.

In some embodiments, data point converter 212 determines a plurality of features associated with a given design problem. When generating the converted data point 310 for a generated design 308, data point converter 212 determines the feature value for each feature included in the plurality of features based on the generated design 308. Data point converter 212 uses the same set of features when generating each converted data point 310 included in the plurality of converted data points 310.

In some embodiments, data point converter 212 determines the plurality of features based on the set of design characteristics 302, set of design rules 304, and/or set design metrics 306. For example, each feature included in the plurality of features could correspond to a different design characteristic 302, design rule 304, or design metric 306. In some embodiments, data point converter 212 uses each design characteristic 302, design rule 304, and design metric 306 that was received by design application 118 as a feature for generating the plurality of converted data points 310. In some embodiments, data point converter 212 selects a subset of design characteristics 302, design rules 304, and/or design metrics 306. For example, data point converter 212 could select design characteristics 302, design rules 304, and/or design metrics 306 that have a numeric value or can be converted into a numeric value. As another example, data point converter 212 could use one of the set of design characteristics 302, the set of design rules 304, or the set of design metrics 306 as features.

In some embodiments, design application 118 receives one or more designs instead of or in addition to receiving a set of design characteristics 302, set of design rules 304, and/or set of design metrics 306. Design application 118 could analyze the one or more designs to identify a plurality of features for use by the data point converter 212. In some embodiments, design application 118 processes the one or more designs to determine a design problem associated with the one or more designs. Design application 118 determines a set of features associated with the design problem. For example, design application 118 could analyze the one or more designs and generate a set of design characteristics 302, a set of design rules 304, and/or a set of design metrics 306.

Data point converter 212 transmits the plurality of converted data points 310 to model trainer 120 as training data set 312. Model trainer 120 receives the training data set 312 and trains a self-organizing map 214 based on the training data set 312. Although FIG. 3 illustrates design application 118 generating the training data set 312 provided to model trainer 120, in other embodiments, a different application could generate the training data set 312 and design application 118 could receive the trained self-organizing map 214 from model trainer 120.

The self-organizing map is a lower-dimension (e.g., two-dimensional) representation of the multi-dimensional data points included in the training data set 312. In some embodiments, the self-organizing map 214 corresponds to a two-dimensional representation of the plurality of generated designs 308. Each map node included in the trained self-organizing map 214 corresponds to a cluster of one or more generated designs 308 that share similar features (e.g., performance metrics, model geometry, cost, design goals met by the design solutions, and/or the like).

Model trainer 120 can train a self-organizing map 214 using any technically feasible techniques or algorithms for training self-organizing maps. For example, in some embodiments, model trainer 120 could determine a weight vector for each node of an untrained self-organizing map based on the training data set 312. The number of nodes included in the self-organizing map can be determined, for example, based on user input (e.g., via user interface 220) or configuration information (e.g., stored in database 122) that specifies the number of nodes. In some embodiments, model trainer 120 is configured to generate self-organizing maps of a given size.

In some embodiments, model trainer 120 generates an initial weight vector for each node in an untrained self-organizing map. Model trainer 120 can use any suitable approach or technique for assigning initial weights to nodes of a self-organizing map, such as random initialization or principal component initialization. For example, model trainer 120 could randomly select a number of multi-dimensional data points equal to the number of nodes in the untrained self-organizing map from training data set 312. Model trainer 120 uses each selected multi-dimensional data point as the weight vector for a different node of the untrained self-organizing map. As another example, model trainer 120 could analyze the training data set 312 to determine a given number of principal components (e.g., first two principal components) associated with the training data set 312. The initial weight vectors are selected from a subspace spanned by the principal components (e.g., the subspace spanned by the first two principal components). Model trainer 120 iteratively adjusts the weight vectors of different nodes in the untrained self-organizing map to produce a trained self-organizing map 214.

In some embodiments, at each iteration, model trainer 120 selects a multi-dimensional data point from training data set 312. Model trainer 120 identifies the node in the untrained self-organizing map that is closest (e.g., shortest Euclidean distance) to the selected multi-dimensional data point. The weight vector of the identified node is adjusted so that the identified node is closer to the multi-dimensional data point. That is, each weight included in the weight vector is adjusted such that the weight is closer to a corresponding value in the multi-dimensional data point. Additionally, the weight vector of one or more nodes in the neighborhood around the identified node are can also be adjusted so that the nodes in the neighborhood around the identified node are also closer to the multi-dimensional data point. In some embodiments, the amount by which the weights included in a weight vector are modified can vary based on the distance between the nodes and/or the number of iterations that have been performed. For example, the amount that the weights for a given node are adjusted could be scaled based on a learning coefficient, where the learning coefficient decreases with every iteration of training. As another example, the amount that the weights for a given node are adjusted could be scaled based on the distance between the given node and the identified node, where the amount decreases as the distance from the identified node increases.

In some embodiments, model trainer 120 identifies one or more nodes in the neighborhood of the identified node for adjusting the weight vector. Any suitable technique or algorithm for identifying nodes in a neighborhood around a given node can be used, such as using concentric squares, hexagons, and other polygonal shapes of a given radius around the identified node, Gaussian functions, Mexican Hat functions, and/or the like. In some embodiments, instead of identifying the one or more nodes, model trainer 120 modifies the weight vectors for each node in the self-organizing map based on a neighborhood function. For example, to adjust the weight included in a weight vector for a given node, the difference between the weight and the corresponding value in the multi-dimensional data point could be determined. The difference is scaled using a neighborhood function. The neighborhood function is based on the distance between the given node and the identified node, and outputs a higher value the closer the given node is to the identified node. Depending on the type of neighborhood function that is used, nodes that are further away from the identified node could be adjusted a smaller amount, not adjusted at all, or could be adjusted away from the identified node. Additionally, the radius that the neighborhood function uses to determine whether a node is close to the identified node could decrease based on the current iteration number. Accordingly, as the number of training iterations increases, the number of nodes that are adjusted decreases.

Model trainer 120 repeats the process of selecting a multi-dimensional data point and adjusting the weight vector for one or more nodes based on the multi-dimensional data point until training is completed. In some embodiments, model trainer 120 performs a given number of iterations of training. In some embodiments, model trainer 120 performs training until the self-organizing map reaches a threshold condition, such as each node of the self-organizing map being within a threshold distance from each neighbor node, the self-organizing map meeting a stability criteria or passing a stability test, each multi-dimensional data point included in the training data set 312 has been processed, and/or the like.

After training is completed, model trainer 120 provides the trained self-organizing map 214 to design application 118. As discussed in further detail below, design application 118 uses the trained self-organizing map 214 to determine the location within the design space of different design models. In some embodiments, design application 118 is a collaborative design application, and multiple instances of design application 118 could be viewing and/or modifying the same design model(s). In such embodiments, model trainer 120 could provide the trained self-organizing map 214 to the multiple instances of design application 118 and/or the instance of design application 118 that receives the trained self-organizing map 214 from model trainer 120 could transmit the trained self-organizing map 214 to the other instances of design application 118.

In some embodiments, design application 118 stores data indicating the plurality of features, for example, in database 122. Additionally, the plurality of features can be stored in association with the trained self-organizing map 214 and used to generate multi-dimensional data points that are used in conjunction with the trained self-organizing map. As discussed in further detail below, data point converter 212 uses the stored data to determine the plurality of features to use when generating multi-dimensional data points for other designs associated with the same design problem.

A design problem is defined by, among other things, the design characteristics of design solutions for the design problem, design rules that are applied when generating design solutions for the design problem, and design metrics that are used to evaluate the design solutions generated for the design problem. The design space for the design problem includes a set of possible design solutions that can solve the design problem (i.e., have the design characteristics 302, meet the design rules 304, can be evaluated using the design metrics 306, and/or the like). The plurality of generated designs 308, therefore, represent different types of design solutions for the design problem defined by the set of design characteristics 302, set of design rules 304, and/or set of design metrics 306. By clustering the generated designs 308 into different map nodes, the trained self-organizing map 214 organizes the generated designs 308, which are associated with many different features (i.e., have a high dimensionality), in a two-dimensional manner, which makes it easier to visualize and compare the different generated designs 308. The nodes of the self-organizing map 214 are organized such that nodes that are closer together have more similar feature values compared to nodes that are further apart. Using the self-organizing map 214 to plot designs onto a two-dimensional grid enables users to easily visualize and compare design models, determine which designs have similar features, and visualize how changes to a given design affects the features of the design and the location of the design within the design space.

Figure 4:
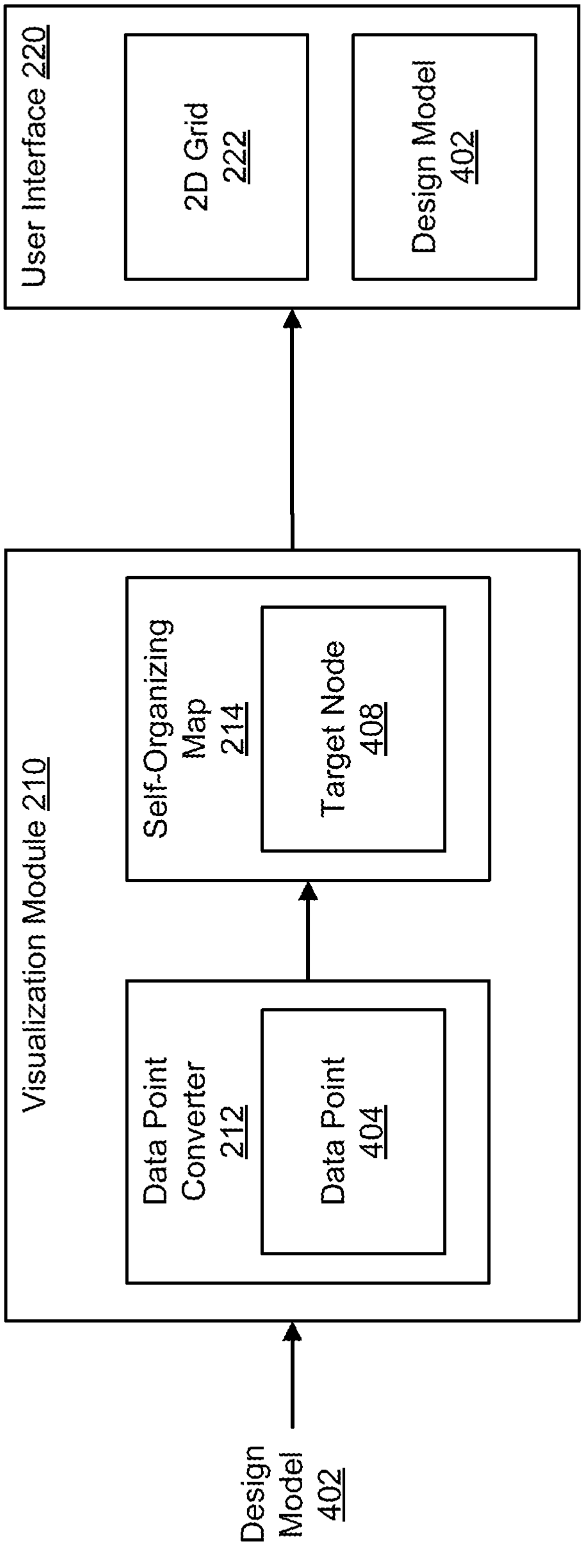
FIG. 4 illustrates an approach for using a trained self-organizing map to map design models to grid positions, according to various embodiments.

FIG. 4 illustrates an approach for using a trained self-organizing map to map design models to grid positions, according to various embodiments. As shown in FIG. 4, visualization module 210 receives a design model 402. In some embodiments, design model 402 is one of a design model for a current design 202, a previous design 204, or a design generated by design generation engine 206. The design model 402 is associated with a given design problem (i.e., is a potential design solution for the given design problem). In some embodiments, design model 402 is a design model received from a different application, such as another instance of a design application 118 or another application that generates design models.

Visualization module 210 uses data point converter 212 to generate a multi-dimensional data point 404 based on the design model 402. Data point converter 212 receives the design model 402 and analyzes the design model 402 to determine one or more feature values for one or more features of the design model 402. The one or more feature values are included in the multi-dimensional data point 404. For example, multi-dimensional data point 404 could be a vector, and each feature value is an element included in the vector. In some embodiments, determining a feature value includes providing the design model 402 or data associated with the design model 402 to one or more analysis or simulation tools and receiving output generated by the one or more analysis or simulation tools.

In some embodiments, data point converter 212 determines a plurality of features associated with the given design problem. Data point converter 212 determines the feature value for each feature included in the plurality of features based on the design model 402. In some embodiments, data point converter 212 retrieves stored data, for example from database 122, that indicates a plurality of features associated with a self-organizing map 214. The plurality of features corresponds to the features used when generating the training data for training the self-organizing map 214. In some embodiments, data point converter 212 analyzes the design model 402 to determine the plurality of features. For example, data point converter 212 could analyze the design model 402 and determine one or more design characteristics, design rules, and/or design metrics associated with design model 402.

Visualization module 210 maps the design model 402 to a target node 408 of a trained self-organizing map 214 based on the multi-dimensional data point 404. In some embodiments, visualization module 210 maps the design model 402 to the target node 408 by determining, based on the multi-dimensional data point 404, the node of self-organizing map 214 that most closely matches the multi-dimensional data point 404. For example, if the multi-dimensional data point 404 is a vector of feature values, visualization module 210 could determine the node whose weight vector is the shortest distance from the from the multi-dimensional data point 404.

Visualization module 210 determines, based on the target node 408, a location within 2D grid 222 that corresponds to the target node 408. In some embodiments, each grid cell within 2D grid 222 corresponds to a different node included in self-organizing map 214. For example, 2D grid 222 could be arranged using the same layout (e.g., same number of rows and same number of columns) as self-organizing map 214. As a result, the corresponding cell within 2D grid 222 has the same coordinates as target node 408. Visualization module 210 determines the corresponding cell based on the coordinates of target node 408.

Visualization module 210 displays a visual representation of design model 402 at the determined location within 2D grid 222. In some embodiments, visualization module 210 displays the visual representation of design model 402 within the grid cell corresponding to target node 408. The visual representation of design model 402 can be any suitable visual representation of design model 402, such as a label, a symbol, a two-dimensional image (e.g., rendered image) of the design model 402, a wireframe of the design model 402, a non-editable version (e.g., read-only or display-only copy) of the design model 402, an editable or interactive version of the design model 402, and/or the like. In some embodiments, the visual representation includes an indication of a version number associated with the design. In some embodiments, the visual representation includes the design model 402, such that a user can zoom in on the design model 402, rotate the design model 402, and/or interact with the design model 402 to modify the design model 402.

In some embodiments, modifying the design model 402 generates a new version of the design model 402. Design application 118 provides the new version of the design model 402 to visualization module 210. Data point converter 212 generates a multi-dimensional data point 404 based on the new version of the design model 402, and visualization module 210 determines a target node 408 corresponding to the new version of the design model 402. The multi-dimensional data point 404 and the target node 408 for the new version of the design model 402 can be different from the multi-dimensional data point 404 and target node 408 that were determined for design model 402.

Visualization module 210 updates user interface 220 to include a visual representation of the new version of the design model 402. The visual representation of the new version of the design model 402 is displayed within the grid cell of 2D grid 222 that corresponds to the target node 408. In some embodiments, visualization module 210 replaces the visual representation of the previous version of design model 402 with the visual representation of the new version of the design model 402. In some embodiments, visualization module 210 displays the visual representation of the previous version of design model 402 in conjunction with the visual representation of the new version of the design model 402. In such embodiments, visualization module 210 can also display an indication that the design changed from the previous version to the new version of design model 402. For example, visualization module 210 could display, in user interface 220, a trajectory that connects the visual representation of the previous version of design model 402 to the new version of design model 402. As another example, visualization module 210 could generate labels, symbols, or other indicators that visually indicate the order in which different versions of design model 402 were generated.

Figure 5:
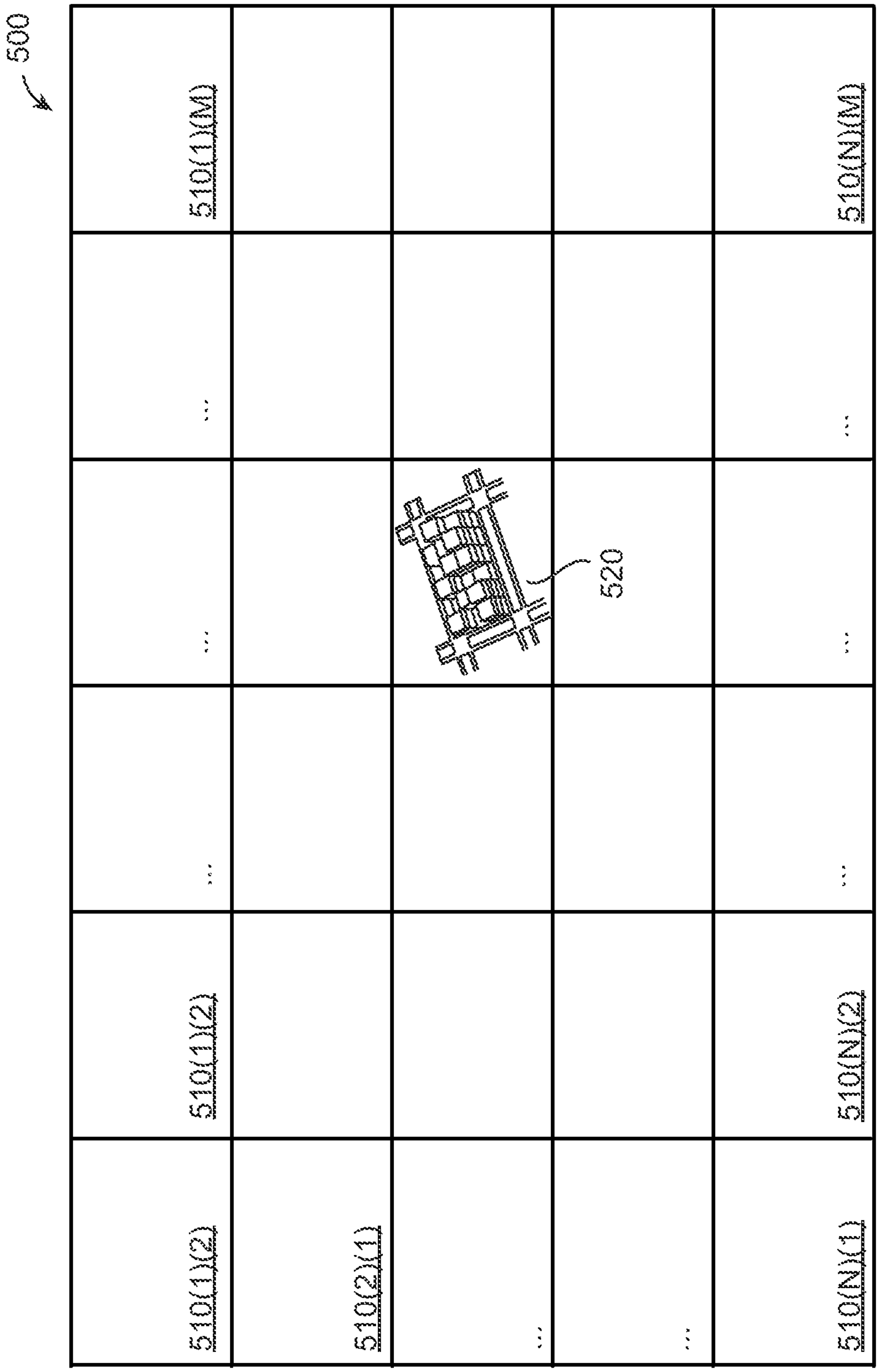
FIG. 5 illustrates a visualization of a design model within a two-dimensional grid, according to various embodiments.

FIG. 5 illustrates a visualization of a design model within a two-dimensional grid, according to various embodiments.

As shown in FIG. 5, a two-dimensional grid 500 is divided into a plurality of grid cells 510. 2D grid 500 includes N rows, M columns, and N×M grid cells 510. Each grid cell 510 corresponds to a different node in a self-organizing map 214. For example, the self-organizing map 214 that is associated with 2D grid 500 includes N rows, M columns, and N×M nodes. Grid cell 510(1)(1) corresponds to the node at the first column of the first row of the self-organizing map 214, grid cell 510(1)(2) corresponds to the node at the second column of the first row of the self-organizing map 214, and so forth.

Grid 500 is a visual representation of the design space for a design problem. Each grid cell 510 represents a different area of the design space (i.e., represents a different group of feature values associated with design solutions for the design problem). In some embodiments, each grid cell 510 is assigned a different color. The grid cell 510 is displayed using the assigned color in user interface 220. Grid cells that are closer together (i.e., have more similar feature values) are associated with colors that are more similar to one another. Grid cells that are further apart (i.e., do not have similar feature values) are associated with colors that are more different from one another. For example, grid cell 510(1)(1) could be assigned a blue color and grid cell 510(N)(M) could be assigned a red color. Grid cells closer to grid cell 510(1)(1), such as grid cell 510(1)(2) and grid cell 510(2)(1), could be assigned different shades of blue. Grid cells closer to grid cell 510(N)(M), such as grid cell 510(N−1)(M) and grid cell 510(N)(M−1), could be assigned different shades of red. Any suitable approach or technique can be used to assign colors to grid cells 510. For example, the numeric values included in the weight vector of the corresponding node of self-organizing map 214 could be used to generate a color value (e.g., red-green-blue (RGB) or cyan-magenta-yellow-key (CMYK) values) for a given grid cell 510.

As shown in FIG. 5, design model 520 is displayed within a given grid cell 510 of grid 500. The grid cell 510 at which design model 520 is displayed corresponds to the node of self-organizing map 214 to which design model 520 is mapped. Displaying design model 520 at the corresponding location within grid 500 visually indicates to users a location of design model 520 within a two-dimensional representation of the design space. Additionally, displaying design model 520 within grid 500 in conjunction with other design models visually indicates whether the design model 520 shares similar feature values (e.g., similar design characteristics, similar design metrics, satisfies similar design rules, and/or the like) with other designs. For example, displaying another design model in the same area of grid 500 (e.g., the same grid cell 510) visually indicates that the other design model shares similar feature values with design model 520.

Figure 6:
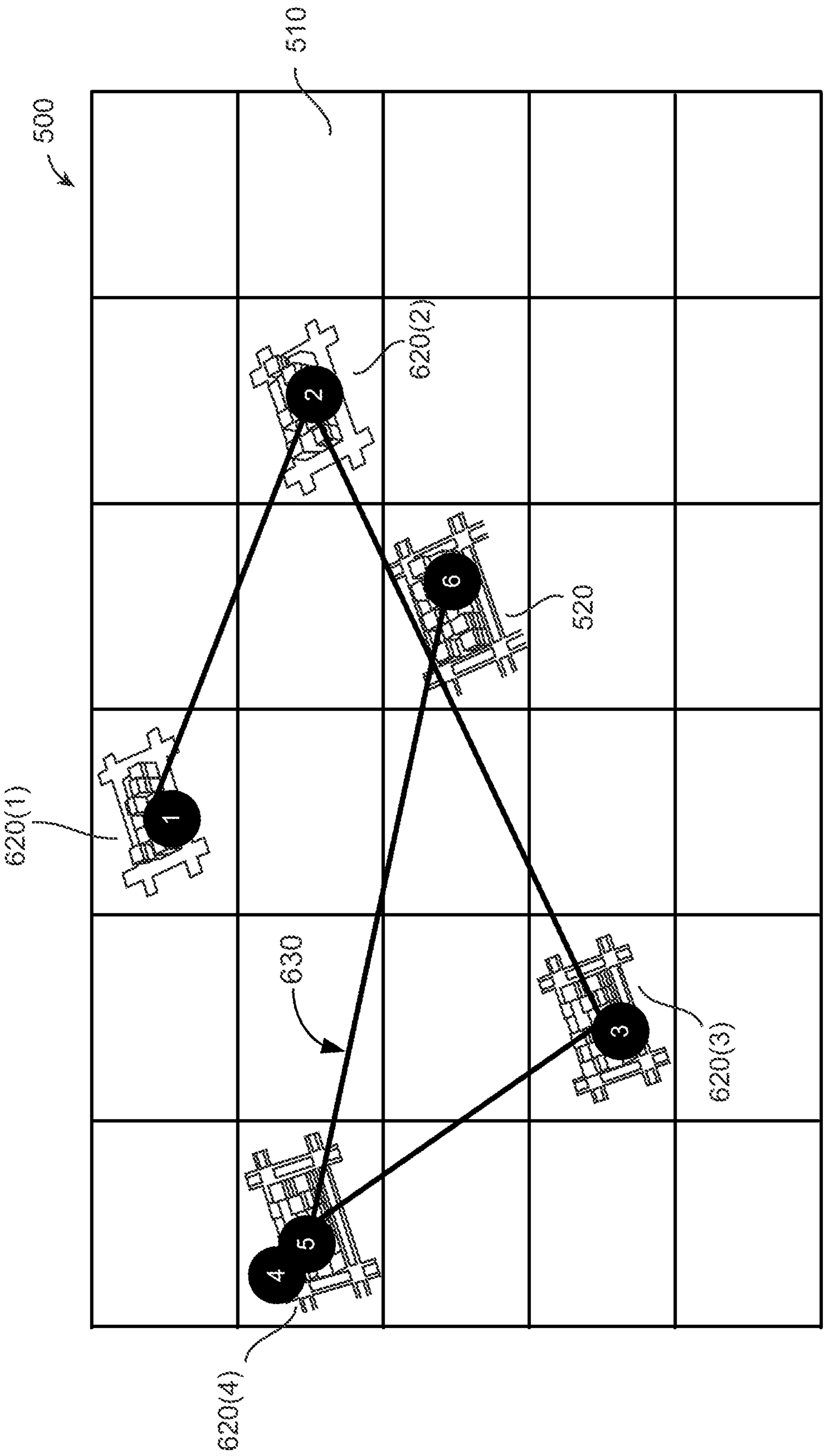
FIG. 6 illustrates a visualization of multiple versions of a design model within a two-dimensional grid, according to various embodiments.

FIG. 6 illustrates a visualization of multiple versions of a design model within a two-dimensional grid, according to various embodiments. As shown in FIG. 6, multiple design models 620(1)-(4) are displayed in conjunction with design model 520. Each design model 620 is displayed within a grid cell 510 that corresponds to the node of self-organizing map 214 to which the design model 620 is mapped.

Additionally, a design trajectory 630 is displayed within grid 500. The design trajectory 630 indicates a relationship between the different design models 620(1)-(4) and 520. As shown in FIG. 6, the design trajectory 630 includes a line that connects design model 620(1) to 620(2), design model 620(2) to 620(3), design model 620(3) to 620(4), and design model 620(4) to design model 520. In addition, design trajectory 630 includes numeric labels that indicate an order in which the design models were generated. As shown, design model 620(1) was first generated. Subsequently, design model 620(1) was modified to generate design model 620(2), which in turn was modified to generate design model 620(3), and so forth. Although FIG. 6 illustrates design trajectory 630 as a line connecting the different design models, any suitable visualization can be used to represent a design trajectory. Additionally, although FIG. 6 illustrates a single line connecting the design models in an order, in other embodiments, the design trajectory could include one or more branches. For example, two or more subsequent versions of a design model could be generated from the same version of a design model. The design trajectory would indicate that each of the subsequent versions were generated based on the same version of the design model.

A design model can be mapped to different grid cells 510 of grid 500 from other design models or can be mapped to the same grid cell 510 as another design model. For example, as shown in FIG. 6, design models 620(1)-(4) are mapped to different grid cells 510. Additionally, as indicated by the labels (4) and (5) on grid 500, the fourth and fifth designs were mapped to the same grid cell 510. In the embodiment illustrated by FIG. 6, one of the design models, design model 620(4), is displayed in user interface 220, while the other design model is not. In some embodiments, zooming in on the grid cell 510 causes additional design models that were mapped to the grid cell 510 to be displayed. In some embodiments, the design models that are mapped to the grid cell 510 are displayed without the user zooming in on the grid cell 510.

By displaying the designs in the same grid cell 510 or displaying an indication that the designs were mapped to the same grid cell 510, design application 118 visually indicates that the two designs are associated with similar feature values. That is, the changes that were made to the fourth design to generate the fifth design did not significantly alter the fourth design. In contrast, the changes that were made to the fifth design to generate the sixth design (design model 520) resulted in a design that has many different feature values and that moved the design to a different area within the design space.

In some embodiments, when a design model is modified, a new version of the design model is generated. The new version is mapped to a grid cell 510 in grid 500 using a trained self-organizing map. A visual representation of the new version of the design model is displayed within the grid cell 510 of grid 500.

Figure 7:
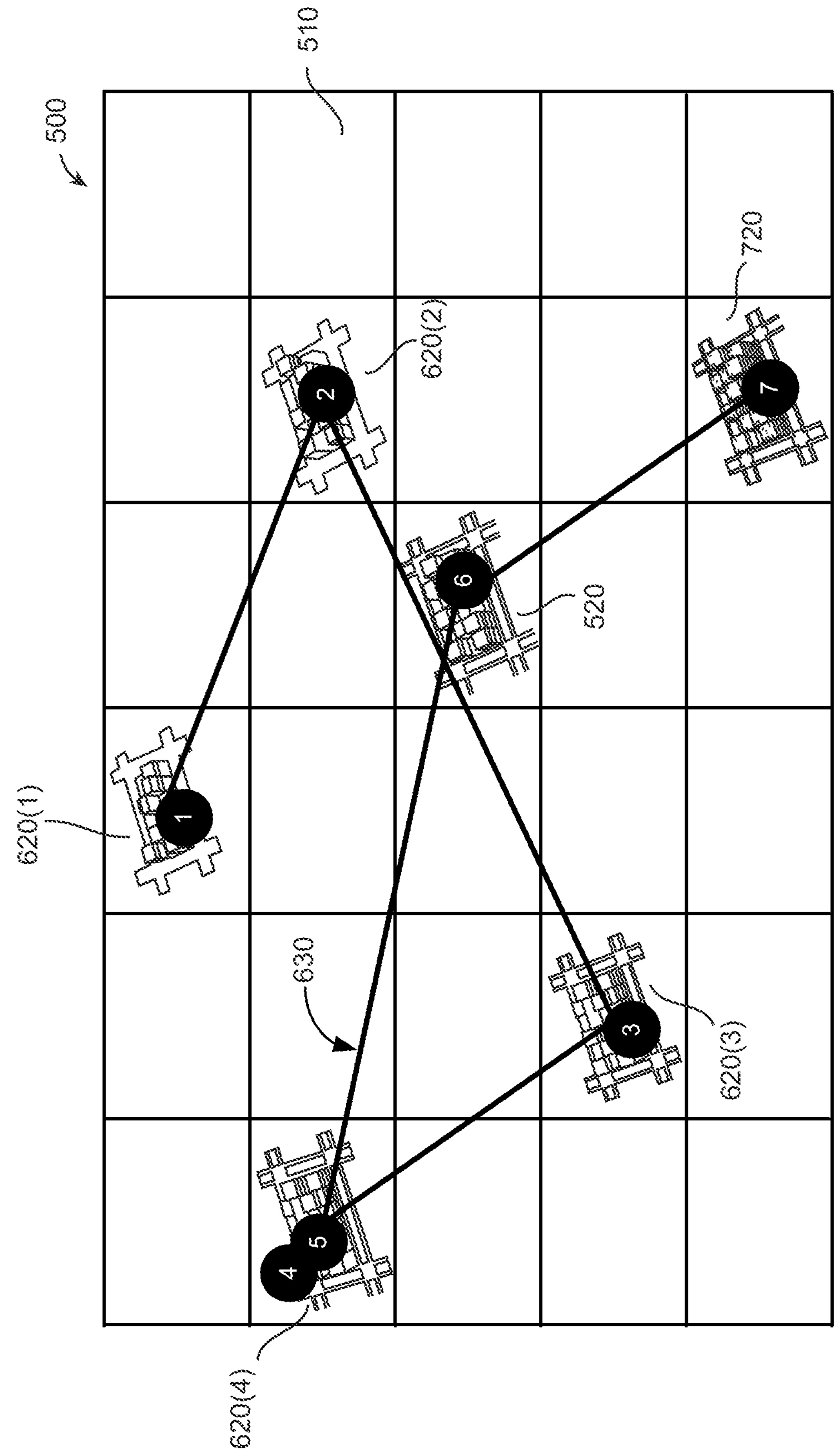
FIG. 7 illustrates a visualization of an updated design model within a two-dimensional grid, according to various embodiments.

FIG. 7 illustrates a visualization of an updated design model within a two-dimensional grid, according to various embodiments. As shown in FIG. 7, a design model 720 is generated based on design model 520. The design model 720 is mapped to a grid cell 510 in grid 500 using self-organizing map 214. A visual representation of design model 720 is displayed within the mapped grid cell 510.

Additionally, as shown in FIG. 7, design trajectory 630 is updated to connect design model 720 to design model 520. The updated design trajectory 630 indicates that design model 720 was generated based on design model 520 (e.g., by modifying design model 520).

By updating the user interface 220 to display a visual representation of the current design model each time the design model is updated, design application 118 is able to provide a real-time indication to users as to the location of the current design model relative to the design space, and how the changes that produced the current design model moved the design model within the design space. As a result, the visualization generated by design application 118 enables users to determine areas of the design space that have not yet been fully explored via previously generated designs and/or areas of the design space that the user would like to explore with subsequent designs.

Process Overview

Figure 8:
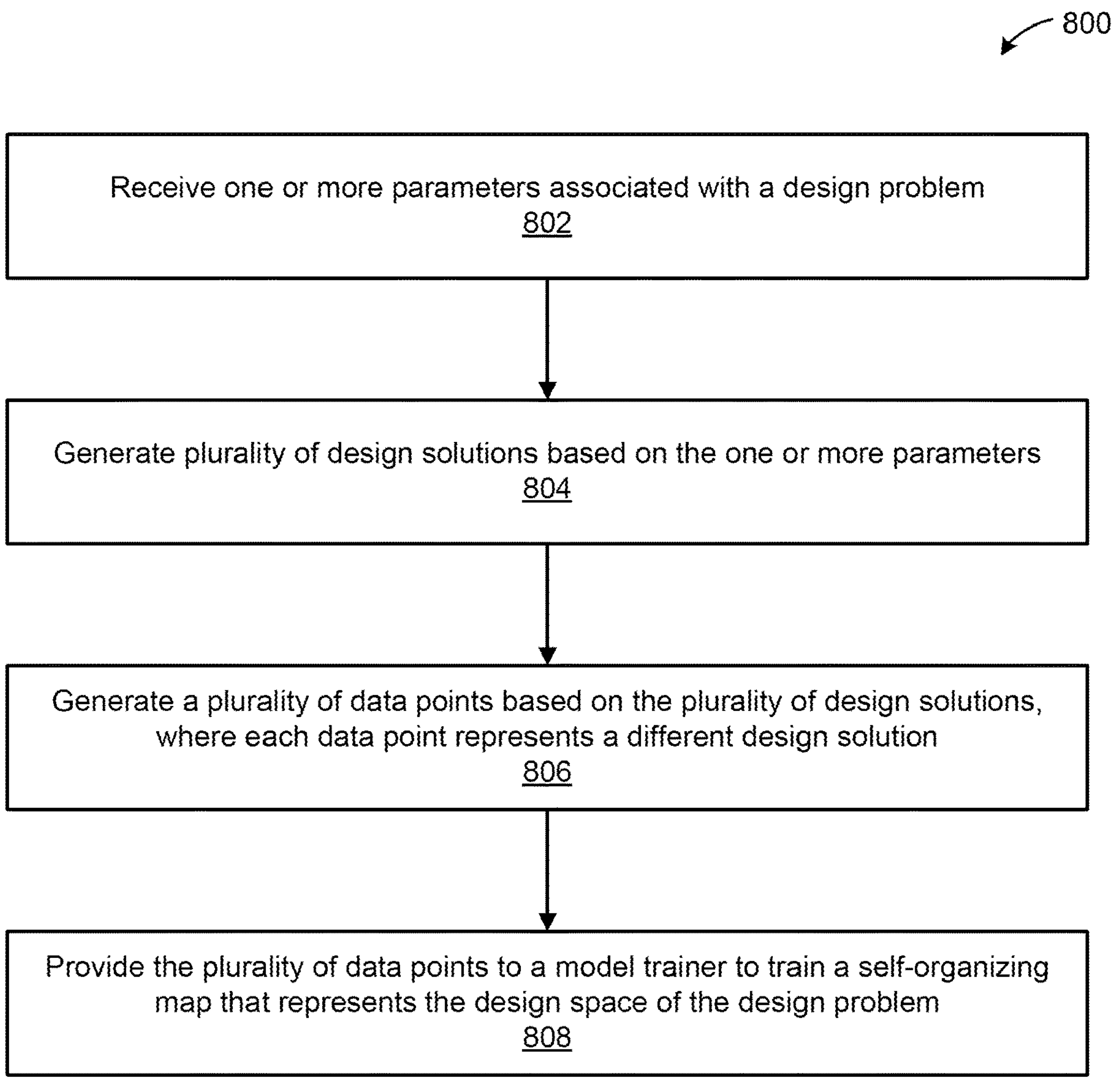
FIG. 8 is a flow diagram of method steps for generating a set of training data for training a self-organizing map based on a design problem, according to various embodiments.

FIG. 8 is a flow diagram of method steps for generating a set of training data for training a self-organizing map based on a design problem, according to various embodiments. Although the method steps are described in conjunction with the systems of FIGS. 1-7, persons of ordinary skill in the art will understand that any system configured to perform the method steps, in any order, is within the scope of the present disclosure.

As shown in FIG. 8, a method 800 begins at step 802, where a design application 118 receives one or more parameters associated with a design problem. For example, design application 118 receives one or more design characteristics 302, one or more design rules 304, one or more design metrics 306, and/or the like. In some embodiments, design application 118 receives one or more design models. Design application 118 determines the one or more parameters associated with the design problem based on the one or more design models.

At step 804, design application 118 generates a plurality of design solutions based on the one or more parameters. Generating a plurality of design solutions is performed in a manner similar to that discussed above with respect to design application 118 and design generation engine 206. For example, design generation engine 206 generates a plurality of designs 308 based on one or more of design characteristics 302, design rules 304, or design metrics 306 received by design application 118.

In some embodiments, design application 118 receives one or more designs instead of, or in addition to, the one or more parameters. Design application 118 generates, for each design, a plurality of design solutions based on the design. For example, design generation engine 206 could perform one or more operations based on a received design to produce a series of generative designs from the received design.

At step 806, design application 118 generates a plurality of data points based on the plurality of design solutions, where each data point represents a different design solution included in the plurality of design solutions. Generating a plurality of data points based on a plurality of design solutions is performed in a manner similar to that discussed above with respect to design application 118 and data point converter 212.

In some embodiments, each data point is a multi-dimensional data point that includes a plurality of data values. Each data value corresponds to a feature value for a feature associated with the design solution represented by the multi-dimensional data point. Design application 118 determines a plurality of features associated with the design problem. Design application 118 analyzes each design solution to determine the feature value for each feature included in the plurality of features. In some embodiments, design application 118 determines the plurality of features associated with the design problem based on the one or more parameters associated with the design problem. Design application 118 could determine, for each parameter, one or more features associated with the parameter. In some embodiments, design application 118 receives one or more design instead of, or in addition to, the one or more parameters. Design application 118 analyzes the one or more designs to determine one or more features associated with the one or more designs.

In some embodiments, analyzing a design solution to determine a given feature value is performed via one or more simulation and/or design analysis tools or applications. For example, design application 118 provides the design solution or data associated with the design solution to a simulation or design analysis tool and receives output generated by the simulation or design analysis tool based on provided data. Additionally, design application 118 could perform further processing on the received output to generate the feature value. In some embodiments, design application 118 is configured to perform design simulation and/or analysis on design solutions. In some embodiments, design application 118 determines, for a given feature, whether design application 118 should send a request to another application or tool. For example, design application 118 could be configured to perform a first type of analysis for generating a feature value for a first feature but send a request to another application for performing a second type of analysis for generating a feature value for a second feature.

At step 808, design application 118 provides the plurality of data points to a model trainer 120. The model trainer 120 trains, using the plurality of data points, a self-organizing map 214 that represents the design space of the design problem. In various embodiments, model trainer 120 can train a self-organizing map 214 using any suitable approach or technique for generating self-organizing maps.

In some embodiments, design application 118 repeats the method 800 for generating a trained self-organizing map in response to receiving user input requesting that the self-organizing map 214 be retrained and/or in response to receiving user input that modifies the design problem. For example, design application 118 could receive user input that adds, removes, and/or modifies one or more parameters associated with the design problem. In response, design application 118 performs the steps 804-808 based on the updated set of parameters to generate an updated self-organizing map 214.

Figure 9:
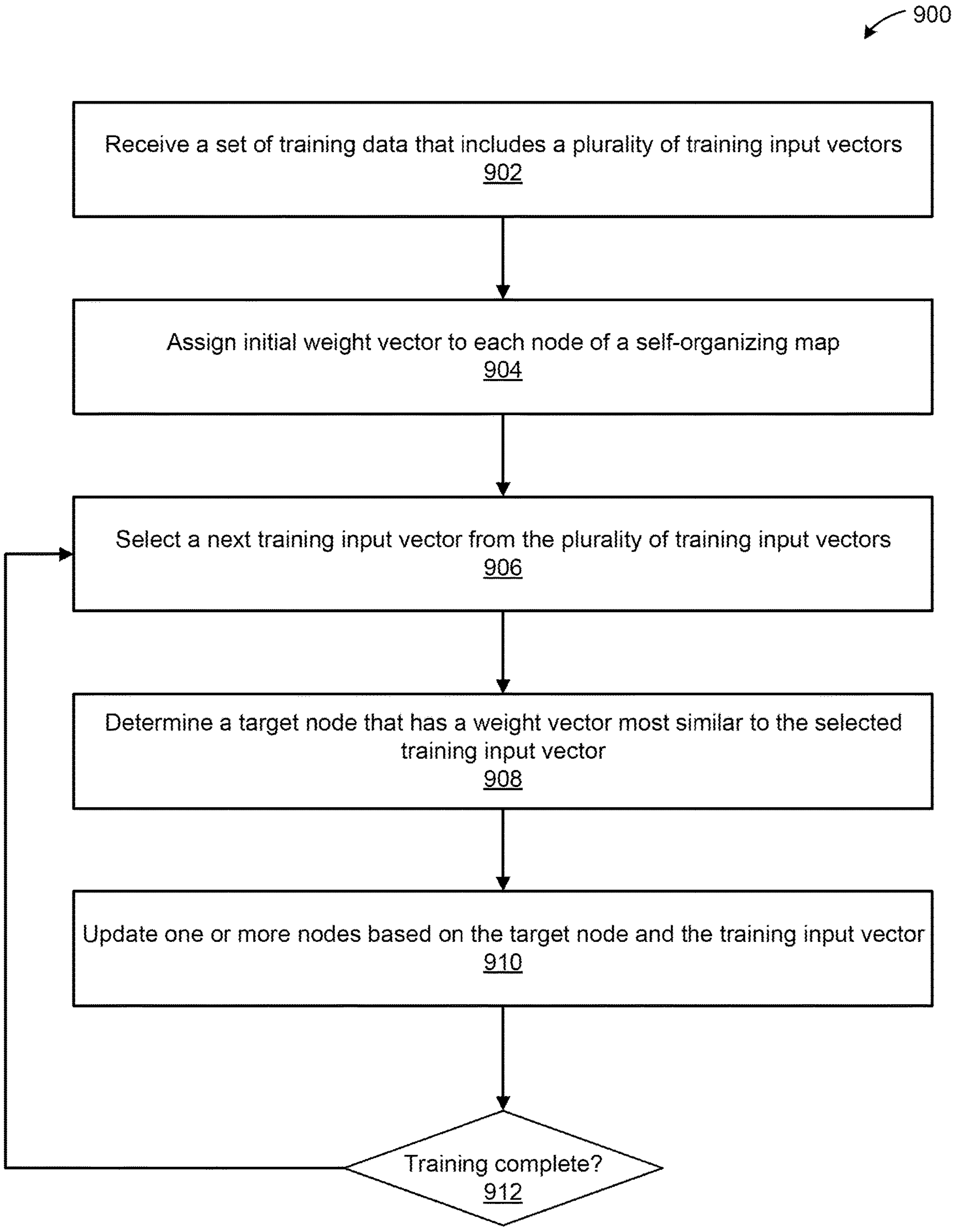
FIG. 9 is a flow diagram of method steps for training a self-organizing map based on a design problem, according to various embodiments.

FIG. 9 is a flow diagram of method steps for training a self-organizing map based on a design problem, according to various embodiments. Although the method steps are described in conjunction with the systems of FIGS. 1-7, persons of ordinary skill in the art will understand that any system configured to perform the method steps, in any order, is within the scope of the present disclosure.

As shown in FIG. 9, a method 900 begins at step 902, where a model trainer 120 receives a set of training data that includes a plurality of training input vectors. Each training input vector includes a plurality of values, where each value corresponds to a feature value for a different feature that is associated with the design problem. For example, model trainer 120 could receive training data set 312 from design application 118. Each training input vector is a converted data point 310 included in training data set 312. Each value included in the converted data point 310 corresponds to a feature value for a different feature of a design solution that is associated with the design problem.

At step 904, model trainer 120 assigns an initial weight vector to each node of an untrained self-organizing map. Assigning an initial weight vector to nodes of the untrained self-organizing map is performed in a manner similar to that discussed above with respect to model trainer 120.

In some embodiments, model trainer 120 randomly generates the weights included in each initial weight vector. For example, model trainer 120 could randomly select a number of training input vectors equal to the number of nodes in the untrained self-organizing map. Model trainer 120 uses each selected training input vector as the weight vector for a different node of the untrained self-organizing map.

In some embodiments, model trainer 120 performs principal component analysis to determine the weights included in each initial weight vector. For example, model trainer 120 could analyze the plurality of training input vectors to determine a given number of principal components (e.g., first two principal components) associated with the plurality of training input vectors. The initial weight vectors are selected from a subspace spanned by the principal components (e.g., the subspace spanned by the first two principal components).

At step 906, model trainer 120 selects a next training input vector from the plurality of training input vectors. In some embodiments, model trainer 120 selects training input vectors from the plurality of training input vectors based on the order in which the training input vectors are included in the set of training data. For example, model trainer 120 selects the first training input vector included in the plurality of training input vectors for the first iteration of training, the second training input vector for the second iteration of training, and so forth. In some embodiments, model trainer 120 selects a random training input vector from the plurality of training input vectors.

At step 908, model trainer 120 determines a target node that has a weight vector most similar to the selected training input vector. In some embodiments, model trainer 120 computes the Euclidean distance between the weight vector for each node and the selected training input vector. Model trainer 120 selects the node with the shortest distance as the target node.

At step 910, model trainer 120 updates one or more nodes of the self-organizing map based on the target node and the selected training input vector. Updating the one or more nodes is performed in a manner similar to that discussed above with respect to model trainer 120.

In some embodiments, model trainer 120 adjusts the weight vector of the target node such that each weight included in the weight vector is closer to the corresponding value included in the selected training input vector. In addition, model trainer 120 adjusts the weight vector for one or more nodes in the neighborhood around the target node such that each weight included in the weight vector is closer to the corresponding value included in the selected training input vector. In some embodiments, determining the neighborhood around the target node is based on a neighborhood radius. Nodes of the self-organizing map that are within the neighborhood radius of the target node are in the neighborhood of the target node. In some embodiments, the neighborhood radius decreases as the number of training iterations increases.

In some embodiments, the amount by which the weights included in a weight vector are modified can vary based on the distance between the nodes and/or the number of iterations that have been performed. In some embodiments, model trainer 120 adjusts the weight vector for one or more nodes that are far away (e.g., over a threshold distance) from the target node such that each weight included in the weight vector is further from the corresponding value included in the selected training input vector.

At step 912, model trainer 120 determines whether training has been completed. In some embodiments, model trainer 120 determines whether one or more stopping or convergence condition has been met. Example conditions include, for example and without limitation, a target number of training iterations, whether the self-organizing map meets a stability criteria, whether all training input vectors have been processed, whether the distance between map nodes is within a threshold range, and/or the like.

In some embodiments, model trainer 120 is configured to perform a target number of iterations of training. Model trainer 120 determines the current number of iterations that have been performed. If the current number of iterations is fewer than the target number, then model trainer 120 determines that training has not yet been completed.

If model trainer 120 determines that training has not been completed, the method 900 returns to step 906, where model trainer 120 selects a next training input vector. If model trainer 120 determines that training is completed, then model trainer 120 stops the training process. The resulting self-organizing map is provided to a design application 118 as a trained self-organizing map 214.

Figure 10:
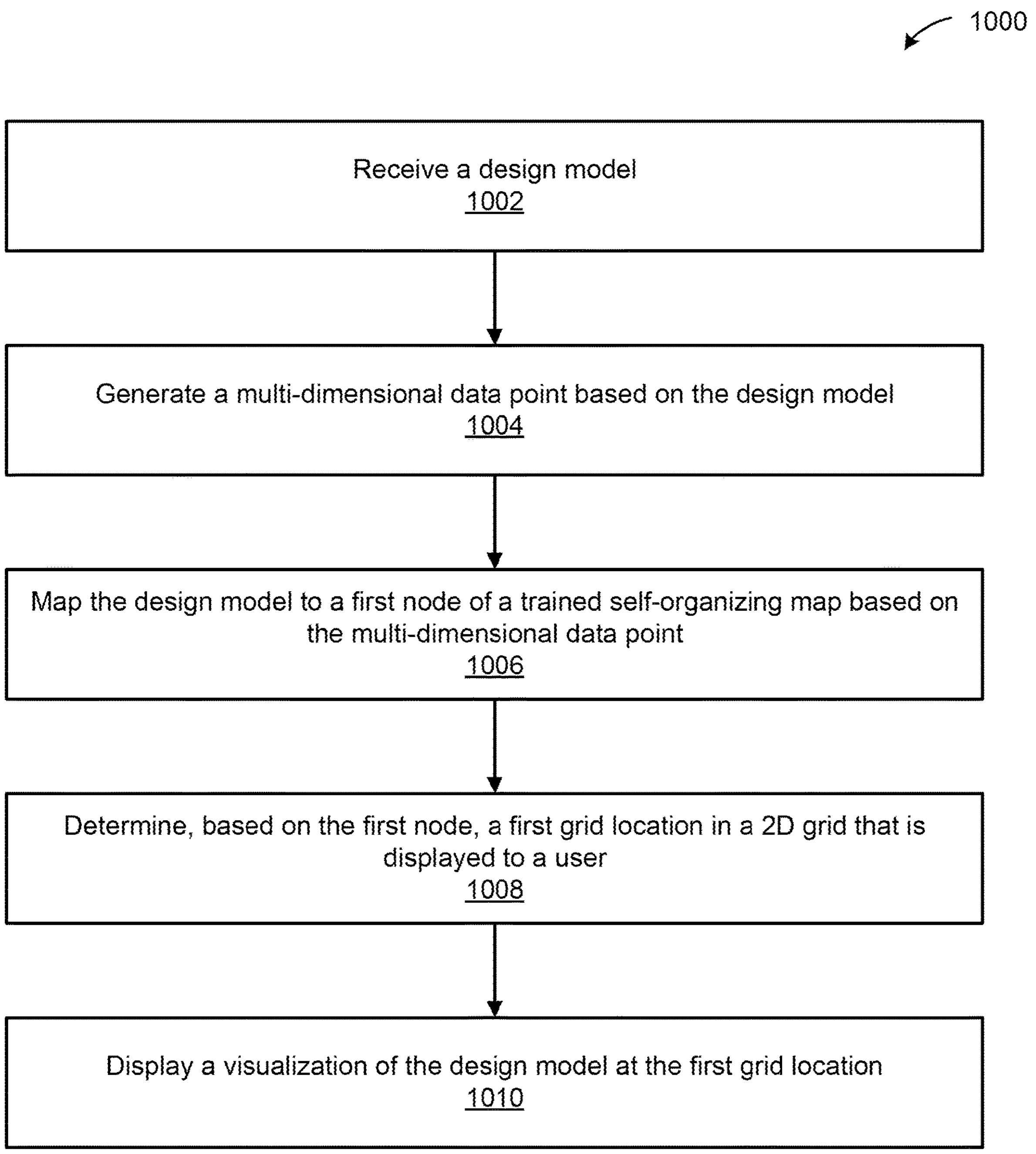
FIG. 10 is a flow diagram of method steps for displaying a visualization of a design model using a trained self-organizing map, according to various embodiments.

FIG. 10 is a flow diagram of method steps for displaying a visualization of a design model using a trained self-organizing map, according to various embodiments.

Although the method steps are described in conjunction with the systems of FIGS. 1-7, persons of ordinary skill in the art will understand that any system configured to perform the method steps, in any order, is within the scope of the present disclosure.

As shown in FIG. 10, a method 1000 begins at step 1002, where a design application 118 receives a design model. The design model is associated with a given design problem. The design model could be, for example, a model of a current design being displayed an edited in design application 118, a previous version of the current design, a design generated by a design generation engine 206 of design application 118, a design generated by another design application or tool, and/or the like. In some embodiments, design application 118 receives data associated with one or more previous versions of a given design. Design application 118 determines, based on the received data, a design model corresponding to each previous version of the given design. Design application 118 performs steps 1004-1010 below for each previous version of the given design. In some embodiments, design application 118 receives a plurality of designs. Design application 118 performs steps 1004-1010 below for each received design.

At step 1004, design application 118 generates a multi-dimensional data point based on the design model. Generating a multi-dimensional data point based on a design model is performed in a manner similar to that discussed above with respect to design application 118 and data point converter 212.

In some embodiments, the multi-dimensional data point includes a plurality of feature values. Each feature value corresponds to a different feature associated with the given design problem. Design application 118 determines a plurality of features associated with the given design problem. Design application 118 analyzes the design model to determine the feature value for each feature included in the plurality of features. In some embodiments, design application 118 determines the plurality of features based on stored data indicating the plurality of features, such as data that indicates the features that were used to generate training data for training the self-organizing map 214. In some embodiments, design application 118 determines the plurality of features by analyzing the design model and determining one or more features that are associated with the design model.

In some embodiments, analyzing the design model to determine a given feature value is performed via one or more simulation and/or design analysis tools or applications. For example, design application 118 provides the design model or data associated with the design model to a simulation or design analysis tool and receives output generated by the simulation or design analysis tool based on provided data. Additionally, design application 118 could perform further processing on the received output to generate the feature value. In some embodiments, design application 118 is configured to perform design simulation and/or analysis on design models. In some embodiments, design application 118 determines, for a given feature, whether design application 118 should send a request to another application or tool. For example, design application 118 could be configured to perform a first type of analysis for generating a feature value for a first feature but send a request to another application for performing a second type of analysis for generating a feature value for a second feature.

At step 1006, design application 118 maps the design model to a first node of a trained self-organizing map based on the multi-dimensional data point. Mapping a design model to a node of a trained self-organizing map is performed in a manner similar to that described above with respect to design application 118, visualization module 210, and self-organizing map 214.

In some embodiments, design application 118 determines, based on the multi-dimensional data point, which node in the trained self-organizing map most closely matches the multi-dimensional data point. For example, design application 118 could compute a distance between the multi-dimensional data point and the vector associated with each node of the trained self-organizing map. Design application 118 determines the node that has the shortest distance to the multi-dimensional data point. In some embodiments, the trained self-organizing map is configured to receive a multi-dimensional data point as input, map the multi-dimensional data point to a given node, and generate output indicating the given node (e.g., a coordinate of the given node). Design application 118 provides the multi-dimensional data point as input into the trained self-organizing map and receives output indicating the first node.

At step 1008, design application 118 determines, based on the first node, a first grid location in a 2D grid that is displayed to a user. Determining a grid location based on a node of a self-organizing map is performed in a manner similar to that discussed above with respect to design application 118, visualization module 210, and 2D grid 222.

In some embodiments, each grid cell within a 2D grid that is displayed in a user interface corresponds to a different node included in the trained self-organizing map. Design application 118 determines the coordinates of the first grid location using the coordinates of the first node within the self-organizing map.

At step 1010, design application 118 displays a visualization of the design model at the first grid location. Displaying a visualization of a design model at a grid location is performed in a manner similar to that discussed above with respect to design application 118, visualization module 210, and user interface 220.

In some embodiments, design application 118 displays a visual representation of the design model at the first grid location within the 2D grid. The visual representation of the design model can be any suitable visual representation, such as a label, a symbol, a two-dimensional image of the design model, a wireframe of the design model, a non-editable version of the design model, an editable and/or interactable version of the design model, and/or the like.

In some embodiments, the visualization includes a visual indication of the design model relative to other designs, for example and without limitation, a version number associated with the design model, a timestamp associated with the design model, one or more lines connecting the design model to other design models from which the design model was derived, one or more lines connecting the design model to other design models that were derived from the design model, one or more modifications to a previous design model that resulted in the design model, and/or the like.

In some embodiments, design application 118 updates a design trajectory that is displayed on the 2D grid in the user interface. The design trajectory connects different visual representations of different design models that are displayed within the 2D grid and indicates the relationships between the design models. For example, the design trajectory could indicate an order in which the different design models were generated and/or which designs were generated by modifying which other designs.

In sum, a design application, such as a collaborative design application, maps design models to locations within a design space for a design problem using a trained self-organizing map. Each node of the self-organizing map represents a different area of the design space, and the design model is mapped to a target node in the trained self-organizing map. Based on the target node, the design application generates a visualization that indicates the location of the design model within the design space. For example, the visualization could include a two-dimensional grid that represents the design space. Each grid cell corresponds to a different node within the trained self-organizing map and to the area of the design space represented by the corresponding node. The design application determines a grid cell corresponding to the target node and displays a visual representation of the design model at the location of the corresponding grid cell.

Additionally, in some embodiments, the design application generates training data used to train the self-organizing map and/or trains the self-organizing map. To generate training data for training the self-organizing map, the design application generates a set of design solutions for a design problem. The design application can generate the set of design solutions based on, for example, one or more parameters that define the design problem and/or one or more initial design solutions associated with the design problem. The design application generates, for each design solution included in the set of design solutions, a multi-dimensional data point corresponding to the design solution. Each data value included in the multi-dimensional data point represents a different feature of the corresponding design solution. The design application provides the set of multi-dimensional data points as training data to a model trainer and/or uses the set of multi-dimensional data points to train a self-organizing map.

To generate a trained self-organizing map, the set of multi-dimensional data points are used to adjust the weight vectors of nodes in an untrained self-organizing map. At each iteration of training, a multi-dimensional data point is selected from the set of multi-dimensional data points. The node whose weight vector is closest to the selected multi-dimensional data point is identified. The weight vector of the node and, optionally, the weight vector(s) of one or more neighboring nodes, are modified based on the selected multi-dimensional data point. Selecting a data point and adjusting the weight vector(s) of different nodes in the self-organizing map is repeated for a number of iterations. After training, the trained self-organizing map is used by the design application to map design models to a location within a design space for the design problem.

At least one technical advantage of the disclosed techniques relative to the prior art is that, with the disclosed techniques, a collaborative design application can track and visualize changes to a design when multiple stakeholders are simultaneously modifying the design. More particularly, the disclosed techniques enable stakeholders to visualize where each previously-considered design falls within a design space and identify design features within the design space that have not been fully considered during the design modification process. As a result, the collaborative design application can guide the stakeholders to generate designs in areas of the design space that have not yet been fully explored. Among other things, the disclosed techniques enable stakeholders to more effectively navigate tradeoffs between different design constraints and stakeholder goals and arrive at more optimal design solutions compared to what can be achieved using prior art techniques. These technical advantages provide one or more technological improvements over prior art approaches.

1. In some embodiments, a computer-implemented method for generating design solutions to one or more design problems comprises receiving a first design model that is associated with a first design problem; generating a first multi-dimensional data point based on the first design model; mapping the first design model to a first node of a trained self-organizing map based on the first multi-dimensional data point, wherein the first node corresponds to a first location within a design space; and displaying a visual representation of the first design model residing at the first location within the design space based on the first node.

2. The computer-implemented method of clause 1, wherein the first multi-dimensional data point comprises a plurality of feature values, and wherein each feature value included in the plurality of feature values corresponds to a different feature associated with the first design model.

3. The computer-implemented method of clause 1 or 2, wherein generating the first multi-dimensional data point comprises determining a plurality of features associated with the first design problem and determining, for each feature included in the plurality of features, a feature value based on the first design model.

4. The computer-implemented method of any of clauses 1-3, wherein mapping the first design model to the first node comprises determining, for each node included in the trained self-organizing map, a distance between the node and the first multi-dimensional data point, and determining that the first node has a shortest distance to the first multi-dimensional data point relative to all other nodes in the trained self-organizing map.

5. The computer-implemented method of any of clauses 1-4, wherein displaying the visual representation of the first design model comprises determining a target location within a two-dimensional representation of the design space based on the first node.

6. The computer-implemented method of any of clauses 1-5, wherein the first design model corresponds to a first version of a design solution to the first design problem, and wherein displaying the visual representation of the first design model comprises displaying a visual indication of a relationship between the first design model and a second design model that corresponds to a second version of the design solution to the first design problem.

7. The computer-implemented method of any of clauses 1-6, further comprising: modifying the first design model to generate a second design model; generating a second multi-dimensional data point based on the second design model; mapping the second design model to a second node of the trained self-organizing map based on the second multi-dimensional data point, wherein the second node corresponds to a second location within the design space that is different than the first location; and displaying a visual representation of the second design model residing at the second location within the design space based on the second node.

8. The computer-implemented method of any of clauses 1-7, further comprising: generating a plurality of training data points based on the first design problem, and generating the trained self-organizing map by generating, for each node included in an untrained self-organizing map, a corresponding weight vector based on the plurality of training data points.

9. The computer-implemented method of any of clauses 1-8, wherein generating the trained self-organizing map comprises: determining, for a first training data point included in the plurality of training data points, that a first node included in the untrained self-organizing map has a shortest distance to the first training data point relative to all other nodes included in the untrained self-organizing map, and updating the corresponding weight vector based on the first training data point.

10. The computer-implemented method of any of clauses 1-9, wherein generating the plurality of training data points comprises: generating a plurality of design solutions based on the first design problem, and generating, for each design solution included in the plurality of design solutions, generating a different training data point based on the design solution.

11. In some embodiments, one or more non-transitory computer-readable media store instructions that, when executed by one or more processors, cause the one or more processors to perform the steps of receiving a first design model that is associated with a first design problem; generating a first multi-dimensional data point based on the first design model; mapping the first design model to a first node of a trained self-organizing map based on the first multi-dimensional data point, wherein the first node corresponds to a first location within a design space; and displaying a visual representation of the first design model residing at the first location within the design space based on the first node.

12. The one or more non-transitory computer-readable media of clause 11, wherein the first multi-dimensional data point comprises a plurality of feature values, and wherein each feature value included in the plurality of feature values corresponds to a different feature associated with the first design model.

13. The one or more non-transitory computer-readable media of clause 11 or 12, wherein generating the first multi-dimensional data point comprises determining a plurality of features associated with the design problem and determining, for each feature included in the plurality of features, a feature value based on the first design model.

14. The one or more non-transitory computer-readable media of any of clauses 11-13, wherein mapping the first design model to the first node comprises determining, for each node included in the trained self-organizing map, a distance between the node and the first multi-dimensional data point, and determining that the first node has a shortest distance to the first multi-dimensional data point relative to all other nodes in the trained self-organizing map.

15. The one or more non-transitory computer-readable media of any of clauses 11-14, wherein displaying the visual representation of the first design model comprises determining a target grid cell included in a two-dimensional grid based on the first node, wherein each grid cell corresponds to a different location within the design space.

16. The one or more non-transitory computer-readable media of any of clauses 11-15, further comprising: generating a plurality of training data points based on the first design problem, and generating the trained self-organizing map by generating, for each node included in an untrained self-organizing map, a corresponding weight vector based on the plurality of training data points.

17. The one or more non-transitory computer-readable media of any of clauses 11-16, wherein generating the plurality of training data points comprises: generating a plurality of design solutions based on the first design problem, and generating, for each design solution included in the plurality of design solutions, generating a different training data point based on the design solution.

18. The one or more non-transitory computer-readable media of any of clauses 11-17, wherein generating the plurality of design solutions comprises receiving one or more parameters associated with the first design problem.

19. The one or more non-transitory computer-readable media of any of clauses 11-18, wherein generating the plurality of design solutions comprises receiving one or more initial design solutions associated with the first design problem.

20. In some embodiments, a system comprises a memory storing a design application; and a processor coupled to the memory that executes the design application to perform the steps of receiving a first design model that is associated with a first design problem; generating a first multi-dimensional data point based on the first design model; mapping the first design model to a first node of a trained self-organizing map based on the first multi-dimensional data point, wherein the first node corresponds to a first location within a design space; and displaying a visual representation of the first design model residing at the first location within the design space based on the first node.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "module," a "system," or a "computer." In addition, any hardware and/or software technique, process, function, component, engine, module, or system described in the present disclosure may be implemented as a circuit or set of circuits. Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for generating design solutions to one or more design problems, the method comprising:

receiving a first design model that is associated with a first design problem;

generating a first multi-dimensional data point based on the first design model;

mapping, via a trained self-organizing map, the first design model to a first node of the trained self-organizing map based on the first multi-dimensional data point, wherein the trained self-organizing map comprises a neural network, the first multi-dimensional data point has more than two dimensions, and the first node corresponds to a first location within a two-dimensional representation of a design space;

displaying a visual representation of the first design model residing at the first location within the two-dimensional representation of the design space based on the first node; and re-training the trained self-organizing map based on training data in response to a user input associated with the first design problem to generate a second trained self-organizing map.

2. The computer-implemented method of claim 1, wherein the first multi-dimensional data point comprises a plurality of feature values, and wherein each feature value included in the plurality of feature values corresponds to a different feature associated with the first design model.

3. The computer-implemented method of claim 1, wherein generating the first multi-dimensional data point comprises determining a plurality of features associated with the first design problem and determining, for each feature included in the plurality of features, a feature value based on the first design model.

4. The computer-implemented method of claim 1, wherein mapping the first design model to the first node comprises determining, for each node included in the trained self-organizing map, a distance between the node and the first multi-dimensional data point, and determining that the first node has a shortest distance to the first multi-dimensional data point relative to all other nodes in the trained self-organizing map.

5. The computer-implemented method of claim 1, wherein displaying the visual representation of the first design model comprises determining a target location within the two-dimensional representation of the design space based on the first node.

6. The computer-implemented method of claim 1, wherein the first design model corresponds to a first version of a design solution to the first design problem, and wherein displaying the visual representation of the first design model comprises displaying a visual indication of a relationship between the first design model and a second design model that corresponds to a second version of the design solution to the first design problem.

7. The computer-implemented method of claim 1, further comprising:

modifying the first design model to generate a second design model;

generating a second multi-dimensional data point based on the second design model;

mapping the second design model to a second node of the second trained self-organizing map based on the second multi-dimensional data point, wherein the second node corresponds to a second location within the design space that is different than the first location; and displaying a visual representation of the second design model residing at the second location within the design space based on the second node.

8. The computer-implemented method of claim 1, further comprising:

generating a plurality of training data points based on the first design problem, and generating the trained self-organizing map by generating, for each node included in an untrained self-organizing map, a corresponding weight vector based on the plurality of training data points.

9. The computer-implemented method of claim 8, wherein generating the trained self-organizing map comprises:

determining, for a first training data point included in the plurality of training data points, that a first node included in the untrained self-organizing map has a shortest distance to the first training data point relative to all other nodes included in the untrained self-organizing map, and updating the corresponding weight vector based on the first training data point.

10. The computer-implemented method of claim 8, wherein generating the plurality of training data points comprises:

generating a plurality of design solutions based on the first design problem, and generating, for each design solution included in the plurality of design solutions, generating a different training data point based on the design solution.

11. One or more non-transitory computer-readable media storing instructions that, when executed by one or more processors, cause the one or more processors to perform the steps of:

receiving a first design model that is associated with a first design problem;

generating a first multi-dimensional data point based on the first design model;

mapping, via a trained self-organizing map, the first design model to a first node of the trained self-organizing map based on the first multi-dimensional data point, wherein the trained self-organizing map comprises a neural network, the first multi-dimensional data point has more than two dimensions, and the first node corresponds to a first location within a two-dimensional representation of a design space; displaying a visual representation of the first design model residing at the first location within the two-dimensional representation of the design space based on the first node; and re-training the trained self-organizing map based on training data in response to a user input associated with the first design problem to generate a second trained self-organizing map.

12. The one or more non-transitory computer-readable media of claim 11, wherein the first multi-dimensional data point comprises a plurality of feature values, and wherein each feature value included in the plurality of feature values corresponds to a different feature associated with the first design model.

13. The one or more non-transitory computer-readable media of claim 11, wherein generating the first multi-dimensional data point comprises determining a plurality of features associated with the first design problem and determining, for each feature included in the plurality of features, a feature value based on the first design model.

14. The one or more non-transitory computer-readable media of claim 11, wherein mapping the first design model to the first node comprises determining, for each node included in the trained self-organizing map, a distance between the node and the first multi-dimensional data point, and determining that the first node has a shortest distance to the first multi-dimensional data point relative to all other nodes in the trained self-organizing map.

15. The one or more non-transitory computer-readable media of claim 11, wherein displaying the visual representation of the first design model comprises determining a target grid cell included in a two-dimensional grid based on the first node, wherein each grid cell corresponds to a different location within the design space.

16. The one or more non-transitory computer-readable media of claim 11, further comprising:

generating a plurality of training data points based on the first design problem, and generating the trained self-organizing map by generating, for each node included in an untrained self-organizing map, a corresponding weight vector based on the plurality of training data points.

17. The one or more non-transitory computer-readable media of claim 16, wherein generating the plurality of training data points comprises:

generating a plurality of design solutions based on the first design problem, and generating, for each design solution included in the plurality of design solutions, generating a different training data point based on the design solution.

18. The one or more non-transitory computer-readable media of claim 17, wherein generating the plurality of design solutions comprises receiving one or more parameters associated with the first design problem.

19. The one or more non-transitory computer-readable media of claim 17, wherein generating the plurality of design solutions comprises receiving one or more initial design solutions associated with the first design problem.

20. A system comprising:

a memory storing a design application; and a processor coupled to the memory that executes the design application to perform the steps of:

receiving a first design model that is associated with a first design problem;

generating a first multi-dimensional data point based on the first design model;

mapping, via a trained self-organizing map, the first design model to a first node of the trained self-organizing map based on the first multi-dimensional data point, wherein the trained self-organizing map comprises a neural network, the first multi-dimensional data point has more than two dimensions, and the first node corresponds to a first location within a two-dimensional representation of a design space; displaying a visual representation of the first design model residing at the first location within the two-dimensional representation of the design space based on the first node; and re-training the trained self-organizing map based on training data in response to a user input associated with the first design problem to generate a second trained self-organizing map.

* * * * *